United States Patent
Yoshida et al.

(10) Patent No.: US 7,364,769 B2
(45) Date of Patent: Apr. 29, 2008

(54) APPARATUS AND METHOD FOR FORMATION OF A WIRING PATTERN ON A SUBSTRATE, AND ELECTRONIC DEVICES AND PRODUCING METHODS THEREOF

(75) Inventors: Yoshihiro Yoshida, Tokyo (JP); Takeshi Sano, Tokyo (JP); Hideaki Ohkura, Tokyo (JP); Hirofumi Kobayashi, Tokyo (JP)

(73) Assignee: Ricoh Company, Ltd., Tokyo (JP)

( * ) Notice: Subject to any disclaimer, the term of this patent is extended or adjusted under 35 U.S.C. 154(b) by 190 days.

(21) Appl. No.: 10/844,428

(22) Filed: May 13, 2004

(65) Prior Publication Data

US 2005/0009327 A1    Jan. 13, 2005

(30) Foreign Application Priority Data

May 13, 2003  (JP)  ............................. 2003-134122
Jun. 24, 2003  (JP)  ............................. 2003-179749

(51) Int. Cl.
*B41M 3/12*    (2006.01)
(52) U.S. Cl. ................. 427/146; 427/422; 347/101
(58) Field of Classification Search ............ None
See application file for complete search history.

(56) References Cited

U.S. PATENT DOCUMENTS

| 5,164,632 | A | 11/1992 | Yoshida et al. |
| 5,262,226 | A | 11/1993 | Yoshida |
| 5,315,206 | A | 5/1994 | Yoshida |
| 5,616,206 | A | 4/1997 | Sakatsu et al. |
| 5,863,620 | A * | 1/1999 | Schafer ............ 427/508 |
| 6,044,762 | A | 4/2000 | DeBoer et al. |
| 6,050,193 | A | 4/2000 | DeBoer et al. |
| 6,063,701 | A | 5/2000 | Kuwazaki et al. |
| 6,243,147 | B1 | 6/2001 | Sano |
| 6,247,640 | B1 | 6/2001 | Kuwazaki et al. |
| 6,472,247 | B1 | 10/2002 | Andoh et al. |
| 6,636,334 | B2 * | 10/2003 | Nakamura ............ 358/434 |
| 7,253,433 | B2 | 8/2007 | Ishida et al. |

FOREIGN PATENT DOCUMENTS

| JP | 63-95697 | 4/1988 |
| JP | 8-187927 | 7/1996 |
| JP | 9-312460 | 12/1997 |
| JP | 11-207959 | 8/1999 |
| JP | 2000-43439 | 2/2000 |
| JP | 2002-215065 | 7/2002 |
| JP | 2002-353575 | 12/2002 |
| JP | 2004-253681 | 9/2004 |

* cited by examiner

*Primary Examiner*—John A. McPherson
*Assistant Examiner*—Daborah Chacko-Davis
(74) *Attorney, Agent, or Firm*—Oblon, Spivak, McClelland, Maier & Neustadt, P.C.

(57) ABSTRACT

A wiring pattern-forming apparatus, includes a transfer plate 15 for transferring a wiring material 11 arranged to form a wiring pattern onto a substrate 10, a wiring material feeder 2 for feeding the wiring material 11 onto the transfer plate 15, and an energy feeder 6, 7 to feed energy to the wiring material 11 fed to the transfer plate 15 by the wiring material feeder 6. By utilizing the energy fed from the energy feeder 6, 7, the viscosity of the wiring material 11 when the material 11 is fed from the material feeder 2 to the transfer plate 15 is made different from that of the wiring material 11 when the material 11 is transferred from the transfer plate 15 to the substrate 10.

10 Claims, 14 Drawing Sheets

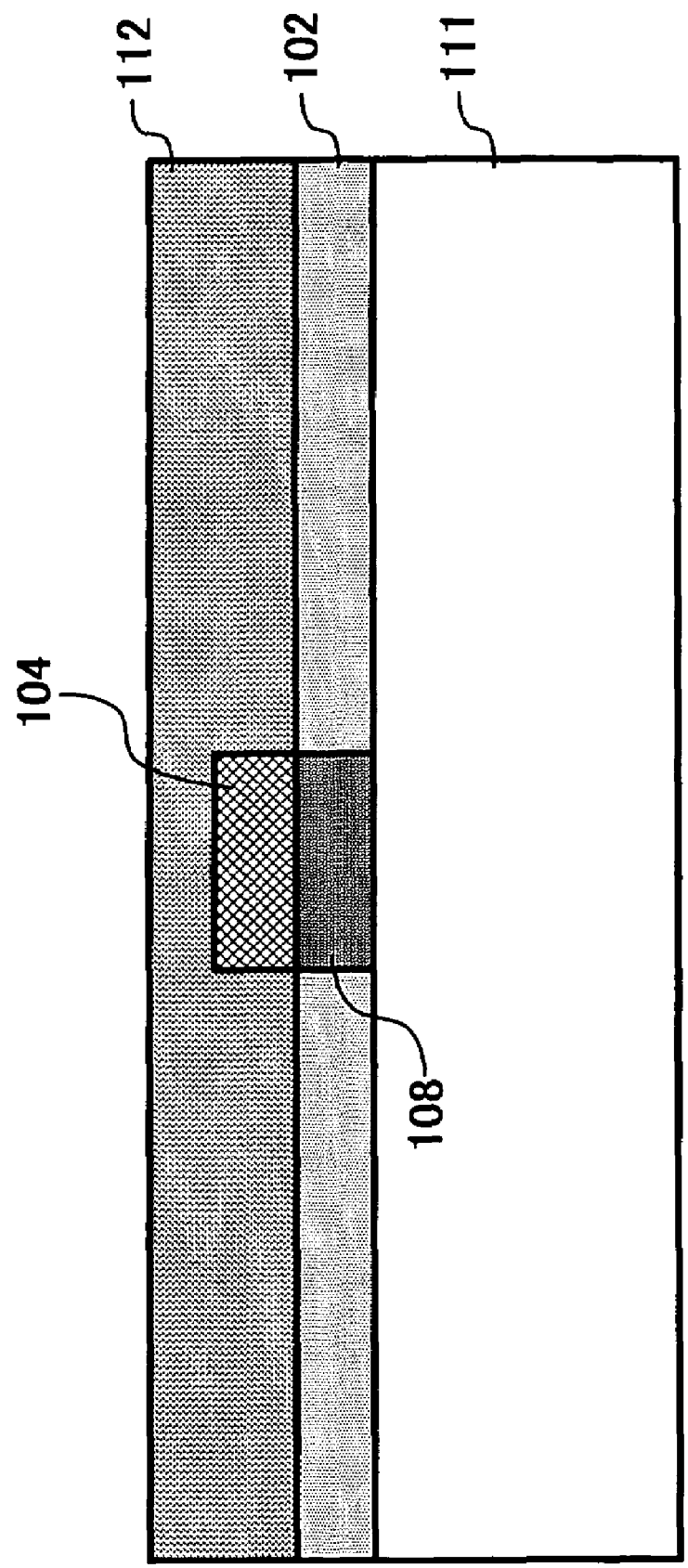

APPARATUS AND METHOD FOR FORMATION OF A WIRING PATTERN ON A SUBSTRATE, AND ELECTRONIC DEVICES AND PRODUCING METHODS THEREOF

BACKGROUND OF THE INVENTION (1) Field of the Invention

The present invention relates to an apparatus and a method for the formation of a wiring pattern on a substrate. More particularly, the invention relates to an apparatus and a method which can transfer the wiring material fed on a transfer plate to a substrate.

The present invention also relates to electronic devices, such as wiring substrates and wiring pattern-transferring sheets, to be used in thin display units, mechanism parts, etc. as well as to production methods therefore. Particularly, the invention is aimed at forming electrically conductive, fine wiring patterns at extremely high accuracy.

(2) Related Art Statement (2-1) First Related Art Statement

As a technique for forming a pattern such as a wiring or a color filter on a substrate, a pattern-forming technique using photolithography is known. This pattern-forming technique is a technique used mainly in forming fine patterns, and is particularly an indispensable technique for forming semiconductor circuits. The pattern-forming technique using the photolithography is also used for forming wirings on substrates greater than the semiconductors (for example, for forming wirings on print substrates). For example, when a pattern is to be formed on a substrate in which a copper foil is bonded onto a resin substrate such as FR-4 (copper foil-bonded glass epoxy plate), such a pattern is formed on the copper plate by etching a surface of the substrate with use of the photolithography.

However, when the patterning technique using the photolithography is employed, a waste material or waste liquid is produced on etching or the like in forming the patterns. Thus, there is a problem that an equipment and a labor are required for disposing of the waste. As one of methods for solving the waste disposal problem, a method is known in which after a wiring pattern is formed on a transfer plate, the pattern is formed on a substrate by transferring the wiring pattern on the transfer plate onto the substrate. When the pattern is formed on the substrate, it is necessary that since the ordinary substrates have poor water-retaining property, a material satisfying both printability and transferability is used and further the method undergoes proper steps. For example, when an ink on the transfer plate is to be transferred on an object to be printed, a transferring method is used in which such an ink as increases its viscosity and becomes semi-solid or solid in response to an external field (electric field or magnetic filed) is placed on given locations on the surface of the transfer plate, and the external field is applied to the ink which has been so placed that the ink may be transferred onto the object, while the shape of the ink placed at the above transfer plate is being maintained, and then the ink is transferred onto the object, while the ink remains the semi-solid or solid state (For example, JP-A 8-187927).

However, when a man uses the above method in which the viscosity of the ink is varied by the external field, the material which changing its viscosity in the external field needs to be employed as the wiring material. When the wiring is formed with such a wiring material, it is feared that the resistance of the wiring changes depending upon an intensity of current passing the wiring. This poses a problem in designing a circuit. Further, the above problem is not limited to the formation of the wiring in the electric circuit. When an optical wiring is provided on a substrate, distributed light beams vary and light transmission decreases as to the material which changes with the magnetic field.

(2-2) Second Related Art Statement

A photo process and an etching process are generally used for producing fine wiring patterns such as wiring pattern substrates and wiring pattern transferring sheets as well as active circuits. Such processes have high production costs, and afford adverse effects upon environment due to their wastes. Further, it has been difficult to form circuits on curved surfaces or a plurality of flat surfaces.

Under the circumstances, circuits have been formed by transferring circuit patterns onto surfaces of transferring objects without using the photo process or the etching process. For example, as described in JP-A 9-312460, a continuous circuit-transferring portion 21 is formed by printing a circuit pattern 26 on a base 22, and a circuit is formed by transferring a circuit pattern 26 on a surface of an object 34 by applying heat and/or pressure from a back face of the base 22.

Further, JP-A 11-207959 describes that a substrate is provided with a circuit pattern in which hydrophilic portions and hydrophobic portions are formed so that when the circuit pattern is formed on the substrate, a fluid material may not too widely spread before drying and the circuit pattern does not broken after drying.

In case that a circuit is formed by transferring a circuit pattern on a surface of transferring object, it is feared that the circuit pattern may undergo damages such as those upon the wiring when a base is peeled. Thus, such is not suitable for fine wiring.

Further, in case that hydrophilic portions and hydrophobic portions are formed to control the shape of an electrically conductive ink on a substrate, a separate patterning process is required for all substrates, and consequently, the product costs rises.

Since a circuit pattern is generally a bundle of continuously slender lines, the formation of the wiring needs to satisfy both continuity and shape accuracy for electrical conduction.

In case that a wiring substrate or a wiring pattern-transferring sheet having a circuit pattern is produced by forming a fine pattern on a support through printing with an electrically conductive ink, the viscosity of the electrically conductive ink must be investigated.

In order to form a fine pattern by printing, the electrically conductive ink used needs to have a low viscosity. This means that an ink jet type needs to discharge a very small amount of a liquid (impossible for piko liters or phenom liters of a high-viscous liquid. Further, in order that an ink may be held at a pattern formed on a printing plate (intaglio printing plates, a relief printing plate, a planograph plates), the ink needs to have a lower viscosity (In case that the viscosity is high, it is feared that contaminated ground or shrot cut occurs).

On the other hand, in order to maintain the shape of the fine pattern formed on the substrate with the electrically conductive ink, the ink needs to have high viscosity (low flowability). Since the pattern shape is not formed on the substrate based on uneven surface or difference in wettability, a low-viscosity ink such as water forms small drops. Therefore, the pattern shape cannot be maintained.

SUMMARY OF THE INVENTION

A. Regarding the above first related art statement, the present invention has been accomplished in view of the above problems, and provides an apparatus and a method for forming a wiring, which easily transferring a wiring pattern on an ordinary substrate by differing the viscosity of a wiring material when the material is printed on a transfer plate from that of the wiring material when the material is transferred from the transfer plate to the substrate.

(1) In order to solve the above problems, the present invention is to provided a wiring pattern-forming apparatus, comprising a transfer plate for transferring a wiring material arranged to form a wiring pattern onto a substrate, a wiring material feeder for feeding said wiring material onto said transfer plate, and an energy feeder to feed energy to said wiring material fed to the transfer plate by said wiring material feeder, wherein by utilizing the energy fed from the energy feeder, a viscosity of said wiring material when the material is fed from the material feeder to the transfer plate is made different from that of the wiring material when the material is transferred from the transfer plate to the substrate.

In the following, various embodiments and aspects of the present invention will be explained. The contents of the basic Japanese Patent application No. 2003-134122 of which the convention priority is claimed in this application are incorporated hereinto by reference. It should be interpreted that the following variations are all encompassed by the claims attached hereto without disclaimer or prejudice.

(2) The wiring pattern-forming apparatus set forth in the above (1), wherein the viscosity of the wiring material when the material is transferred from the transfer plate to the substrate is made greater than that of said wiring material when the material is fed from the material feeder to the transfer plate.

(3) The wiring pattern-forming apparatus set forth in the above (2), wherein the wiring material is changed to a gelled state when the viscosity is made greater.

(4) The wiring pattern-forming apparatus set forth in the above (2) or (3), wherein the viscosity of the wiring material is increased by heating the material with the energy fed from the energy feeder.

(5) The wiring pattern-forming apparatus set forth in the above (2) and (3), wherein the viscosity of the wiring material is increased by cooling the material with energy fed from the energy feeder.

(6) The wiring pattern-forming apparatus set forth in the above (4), wherein the wiring material contains soluble cellulose.

(7) The wiring pattern-forming apparatus set forth in the above (4), wherein the energy is fed to the wiring material by heating the transfer plate with the energy feeder.

(8) The wiring pattern-forming apparatus set forth in the above (7), wherein the wiring material is heated to 50° C. to 70° C. with the energy feeder.

(9) The wiring pattern forming apparatus set forth the above (4), wherein the energy is fed to the wiring material by heating the transfer plate with the energy feeder.

(10) The wiring pattern-forming apparatus set forth in the above (9), wherein the wiring material is solidified by heating the material with said energy.

(11) The wiring pattern-forming apparatus set forth in the above (3), wherein the wiring material is changed to the gelled state by crosslinking through a chemical reaction.

(12) The wiring pattern-forming apparatus set forth in the above (11), wherein the wiring material is crosslinked through the chemical reaction on irradiation with light as said energy from the energy feeder.

(13) The wiring pattern-forming apparatus set forth in any one of the above (1) to (12), wherein the transfer plate is installed around an outer periphery of a cylindrical roller.

(14) The wiring pattern-forming apparatus set forth in any one of the above (1) to (13), wherein the transfer plate is formed with a wiring pattern comprising hydrophilic portions and hydrophobic portions.

(15) The present invention is also to provide a method for forming a wiring pattern with a wiring material, which comprises feeding the wiring material from a wiring material feeder to a transfer plate in such as manner that the wiring pattern may be formed on the transfer plate, feeding energy to the wiring material fed on the transfer plate from the wiring material feeder, and thereby making a viscosity of the wiring material when the wiring material is fed from the wiring material feeder to the transfer plate different from that of the wiring material when the wiring material is transferred from the transfer plate to the substrate.

In the following, various embodiments of the wiring pattern-forming method will be recited. It should be interpreted that these variations are encompassed by the claims attached hereto.

(16) The wiring pattern-forming method set forth in the above (15), wherein by feeding the energy to the wiring material with the energy feeder, the viscosity of the wiring material when the material is transferred from the transfer plate to the substrate is made greater than that of said wiring material when the material is fed from the material feeder to the transfer plate.

(22) The wiring pattern-forming method set forth in the above (16), wherein by feeding the energy to the wiring material with the energy feeder, the wiring material is changed to a gelled state to increase the viscosity of the material.

(18) The wiring pattern-forming method set forth in the above (16) or (17), wherein the viscosity of the wiring material is increased by heating the material with the energy fed to the wiring material from the energy feeder.

(19) The wiring pattern forming method set forth in the above (16) or (17), wherein the viscosity of the wiring material is increased by cooling the material with energy fed from the energy feeder.

(20) The wiring pattern-forming method set forth in the above (18), wherein the wiring material contains soluble cellulose.

(21) The wiring pattern-forming method set forth in the above (18), wherein the energy is fed to the wiring material by heating the transfer plate with the energy feeder.

(22) The wiring pattern-forming method set forth in the above (21), wherein the wiring material is heated to 50° C. to 70° C. with the energy feeder.

(23) The wiring pattern-forming method set forth in the above (18), wherein the energy is fed to the wiring material by beating the transfer plate with the energy feeder.

(24) The wiring pattern-forming method set forth in the above (23), wherein the wiring material is solidified by feeding energy to the material with said energy feeder.

(25) The wiring pattern-forming method set forth in the above (17), wherein the wiring material is changed to the gelled state by crosslinking the material via a chemical reaction through feeding the energy to the wiring material with the energy feeder.

(26) The wiring pattern-forming method set forth in the above (25), wherein the wiring material is crosslinked through the chemical reaction via an action of light on irradiation of the wiring material with the light as said energy from the energy feeder.

(27) The wiring pattern-forming method set forth in any one of the above (15) to (26), wherein the transfer plate is installed around an outer periphery of a cylindrical roller.

(28) The wiring pattern-forming method set forth in any one of the above (15) to (27), wherein the transfer plate is formed with a wiring pattern comprising hydrophilic portions and hydrophobic portions.

When the wiring pattern-forming apparatus and the wiring pattern-forming method according to the present invention, the viscosity of the wiring material when the wiring material is changed from the transfer plate to the substrate is made different from that of the wiring material when the wiring material is fed from the material feeder to the transfer plate, so that the wiring material can be easily transferred onto the substrate.

B. Regarding the above second related art statement, the present invention is to form fine wiring patterns and active circuits by using a printing or transferring processing technique, inexpensively and free from adverse effects upon the environment, without using a photo processing or etching processing, and to form circuits on faces constituted by curved faces or a plurality of flat faces. Problems to be solved by the present invention are as follows In the following, various embodiments and aspects of the present invention will be explained. The contents of the basic Japanese Patent application No. 2003-179749 of which the convention priority is claimed in this application are incorporated hereinto by reference. It should be interpreted that the following variations are all encompassed by the claims attached hereto without disclaimer or prejudice.

(Problem 1)

According to Problem 1, in a process for producing an electronic device such as a wiring substrate or a wiring pattern-transferred sheet, by forming a viscosity-increasing layer of a water-soluble polymer on a support, the viscosity of the electrically conductive ink is changed from a low level to a high level between before and after a fine wiring is printed (transferred) on the support with an electrically conductive ink, and an electrically conductive wiring patter is formed at high accuracy on the support, while continuity for electrical conduction is maintained. The "viscosity-increasing layer" is a layer which can increase the viscosity of the electrically conductive ink at a contacting portion between them through a phenomenon that water contained in the ink moves into the viscosity-increasing layer, while the water-soluble polymer is impregnated (含浸) or dissolved with the moving water. The "water-soluble polymer" herein used means polymers having groups, such so OH groups and/or —COOH groups which can make the polymers to be dissolved in water.

(Problem 2)

According to Problem 2, a viscosity-increasing layer of a water-solluble polymer is formed on a releasable support, and a wiring pattern-transferring sheet is produced by forming an electrically conductive wiring pattern on the viscosity-increasing layer. Thus, even when the transferring support (substrate) is constituted by a curved face and/or a plurality of flat faces, an electronic device such as a wiring substrate or a transistor having an electrically conductive wiring pattern at high accuracy can be produced. Further, when the releasable support is released off, damages such as damages upon the wiring pattern can be prevented.

(Countermeasures to Solve Problems)

(Solution 1)

In order to solve the above Problem 1, the present invention provides a method for producing a wiring substrate, comprising: producing a wiring pattern-forming substrate, by forming a viscosity-increasing layer of a water-soluble polymer on a support; gforming a given pattern of an aqueous, electrically conductive ink on the viscosity-increasing layer; and forming a given electrically conductive wiring pattern on the substrate by curing the electrically conductive ink.

By forming the given pattern of the aqueous, electrically conductive ink on the viscosity-increasing layer of the wiring pattern-forming substrate, the viscosity of the electrically conductive ink is changed from a lower level to a higher level at a contact portion between the electrically conductive ink and the water-soluble polymer. This can prevent disturbance of the given pattern, and form the continuous electrically conductive wiring pattern on the support at high accuracy.

Embodiment 1

Embodiment 1 is directed to the wiring substrate-producing method of Solution 1 in which the viscosity-increasing layer comprises water-soluble cellulose.

Since cellulose dissolves in the contact portion between the aqueous, electrically conductive ink and the water-soluble cellulose, the viscosity of this portion increases to prevent the given pattern from being disturbed. Further, the water-soluble cellulose is highly safe and inexpensive.

Embodiment 2

Embodiment 2 is directed to the method for producing the wiring substrate in Solution 1 and Embodiment 1 in which the thickness of the viscosity-increasing layer is not more than 1 μm.

Influences by absorption of water can be eliminated by thinning the viscosity-increasing layer, so that both the continuity and the shape accuracy for electrical conduction of the electrically conductive wiring pattern can be satisfied.

Embodiment 3

Embodiment 3 is directed to the method for producing the wiring substrate in any one of Solution 1 and Embodiments 1 and 2, wherein said electrically conductive ink is an ink comprising a solvent composed mainly of water, electrically conductive fine particles dispersed in the solvent and a compound having 2 or more functional groups reacting with OH groups dissolved in the solvent, and a part of the viscosity-increasing layer is insolubilized.

Since the electrically conductive ink contains the OH group-reactive functional groups, the portion under the electrically conductive wiring pattern can be selectively insolubilized.

Embodiment 4

Embodiment 4 is directed to the method for producing the wiring substrate set forth in Embodiment 3, wherein the entirety of the viscosity-increasing layer is insolubilized by coating an insolubilizing solution on the viscosity-increasing layer.

The entire viscosity-increasing layer can be changed to a non-dissolved layer by insolubilizing the entire viscosity-increasing layer through coating the layer with the insolubilizing solution.

Embodiment 5

Embodiment 6 is directed to the method for producing the wiring substrate set forth in any one of Solution 1 and Embodiment 1 to 4, wherein said given pattern is formed with the electrically conductive ink on the viscosity-increasing layer by using a plate on which a given pattern is formed with said electrically conductive ink based upon difference in wettability.

The given pattern can be formed with the electrically conductive ink on the viscosity-increasing layer by printing (transferring) the given pattern formed with said electrically conductive ink on the plate based on difference in wettability.

Embodiment 6

Embodiment 6 is directed to a method for producing a wiring pattern-transferring sheet, comprising: producing a wiring pattern-forming sheet by forming a viscosity-increasing layer of a water-soluble polymer on a support made of a material exhibiting releasability to the viscosity-increasing layer; forming a given pattern of an aqueous, electrically conductive ink on the viscosity-increasing layer; and forming a given electrically conductive wiring pattern on the wiring pattern-forming sheet by curing the electrically conductive ink.

By forming the given pattern of the aqueous, electrically conductive ink on the viscosity-increasing layer of the wiring pattern-forming sheet, the viscosity of the electrically conductive ion is changed from a low level to a high level at a contacting portion between the electrically conductive ink and the water-soluble polymer consequently, the shape of the above given pattern can prevented from being disturbing, so that the electrically conductive wiring pattern can be formed at a high accuracy on the support exhibiting releasability to the viscosity-increasing layer.

Embodiment 7

Embodiment 7 is directed to the method for producing the wiring pattern-transferring sheet in Embodiment 6, which further comprises forming an organic semiconductor layer on said given electrically conductive wiring pattern and the viscosity-increasing layer.

(Solution 2)

Solution 2 is directed to a method for producing a wiring substrate by bonding the wiring pattern-transferring sheet produced by the method in embodiment 6 to a transferring support to which a wiring pattern is to be transferred, said producing method comprising: forming an adhesive layer on the transferring support; bonding said wiring pattern-transferring sheet on said transferring support by heating and pressing in such a manner that the wiring pattern-transferring sheet and the transferring support are located on opposite sides; releasing the wiring pattern-transferring sheet from the remaining; and washing off with water that portion of the viscosity-increasing layer of the wiring pattern-transferring sheet which has not been insolubilized.

The wiring substrate can be produced by transferring the electrically conductive wiring pattern on the transferring substrate through bonding the wiring pattern-transferring sheet produced by the producing method of Embodiment 6 on the transferring support, releasing the wiring pattern-transferring sheet from the remaining, and washing off with water the viscosity-increasing layer of the wiring pattern-transferring sheet which has not been insolubilized. The viscosity-increasing layer of the wiring pattern-transferring sheet functions as the water-soluble wiring pattern-holding layer. Damages such as deterioration of the wiring owing to releasing can be prevented by peeling the support after the transferring and dissolving off the wiring-holding layer (viscosity-increasing layer). That non-dissolved portion of the viscosity-increasing layer which has been insolubilized becomes a protective layer for the electrically conductive wiring pattern. This protective layer can be formed simultaneously with transferring at one time.

Embodiment 1

Embodiment 1 is directed to the method for producing the wiring substrate in Solution 2, wherein said transferring support comprises a surface constituted by a curved surface and/or a plurality of flat surfaces.

Even when the transferring support comprises a surface constituted by a curved surface and/or a plurality of flat surfaces, the electrically conductive wiring pattern can be formed on the transferring support at a high accuracy.

Embodiment 2

Embodiment 2 is directed to a method for producing a transistor by joining the wiring substrate produced by the producing method in Solution 2 to the wiring pattern-transferring sheet produced by the producing method in Embodiment 7, said method comprising: removing the insolubilized portion of the viscosity-increasing layer of the wiring substrate; forming an insulating layer on the wiring substrate on a side of the wiring substrate from which the insolubilized portion of the viscosity-increasing layer is removed; aligning the insulating layer-formed wiring substrate with the wiring pattern-transferring sheet and then adhering and joining by heating the wiring pattern-formed substrate to the wiring pattern-transferring sheet such that the wiring pattern-forming substrate and the support of the wiring pattern-transferring sheet are located on opposite sides; releasing said support from the remaining; and removing the viscosity-increasing layer by dissolution.

The transistor can be produced by joining the wiring substrate produced by the producing method in Solution 2 to the wiring pattern-transferring sheet produced by the method in Embodiment 7 via the insulating layer and releasing the support of the wiring pattern-transferring sheet from the remaining. Thus, the transistor can be produced by printing/transferring process, so that an active circuit can be formed on a surface constituted by curved surface and/or a plurality of flat surfaces.

BRIEF DESCRIPTION OF THE DRAWINGS

For a better understanding of the invention, reference is made to the attached drawings, wherein:

FIG. 13 is a schematic view of a wiring pattern-transferring sheet in which an organic semiconductor layer is formed on an electrically conductive wiring pattern and a viscosity-increasing layer.

DETAILED DESCRIPTION OF THE INVENTION

EXAMPLE 1

Specific embodiments of the wiring pattern-forming apparatus according to the present invention will be explained with reference to the attached drawings.

Embodiment 1

In the following, a first embodiment of the wiring pattern-forming apparatus according to the present invention will be explained with reference to FIG. 1.

Figure 1:
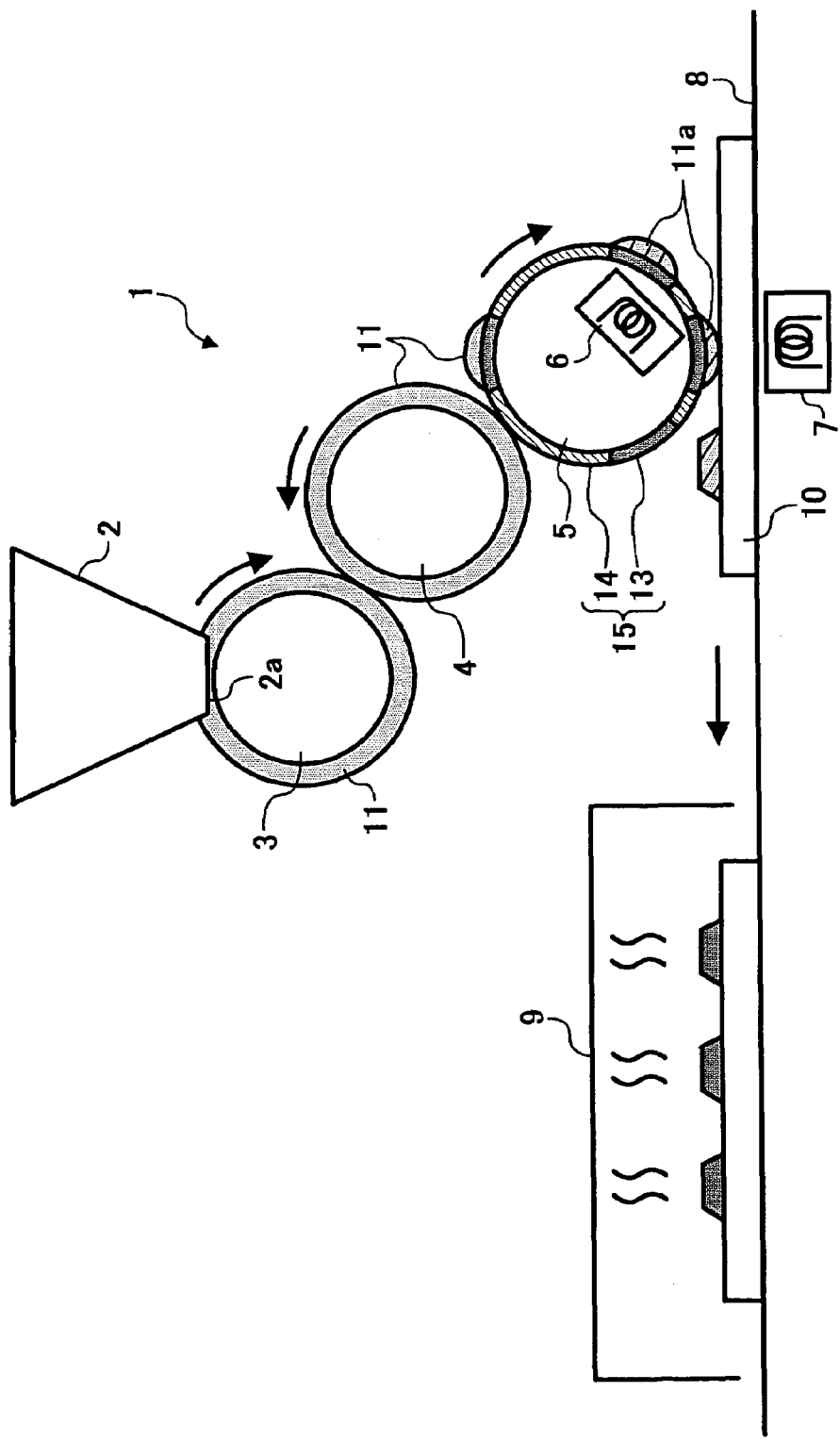
FIG. 1 is a schematic view showing the construction of a wiring pattern-forming apparatus used in Embodiment 1.

As shown in FIG. 1, the wiring pattern-forming apparatus 1 according to the first embodiment of the present invention comprises an ink feed tank 2, a kneading roller 3, a feed roller 4, a printing barrel roller 5, heater blocks 6, 7, a transfer stage 8 and an oven 9.

The ink feed tank 2 is a container tank in which is received a wiring material 11 to be used for transferring as a wiring pattern onto a substrate 10. An appropriate amount of the wiring material 11 is fed onto the kneading roller 3 through a feed opening 2a formed at a bottom portion of the tank.

The kneading roller 3 sufficiently kneads the wiring material 11 so that the wiring material 11 may be fed and coated in a uniform thickness on the printing barrel roller 6 when the wiring material 11 is fed onto the printing barrel 5 roller by the feed roller 4. The wiring material 11 which is kneaded with the kneading roller 3 is fed onto the printing barrell roller 5 after being spread by the feed roller 4 in a thickness suitable for the formation of the wiring.

The printing barrel roller 5 is formed by using stainless steel as a mother material to suppress heat conduction, and its outer face is attached with a transferring plate 15 in which a wiring pattern is formed by hydrophilic portions 13 and hydrophobic portions 14.

In order to form the wiring pattern on the transfer plate 15, a heat-sensitive, hydrophilic material (a fluorine-containing acrylate TG-702 manufactured by Daikin Industries, Ltd.) is first coated on a PET film, and the entire surface is made hydrophilic by immersing theg film into ethylene glycol at 90° C. for 30 seconds. Thereafter, a wiring pattern is drawn on the film by using a semiconductor laser (LN9830 manufactured by Matsushita Communications Industrial, Co., Ltd.), thereby forming hydrophobic portions on the PET film. This processing can form a hydrophilic/hydrophobic pattern on the PET film, while a hydrophilic linear pattern can be formed with hydrophilic portions 13 having about 20 μm-linear width hydrophilic portions 13. The processed film is attached to the printing barrel plate 15 as the transfer plate 15.

As the wiring material 11, 400 μl of a silver colloidal aqueous solution (Fine sphere SVW102 manufactured by Nippon Paint Co., Ltd.) into which 10 μl of 5 wt. % cellulose aqueous solution (Metolose manufactured by Shin-Etsu Chemical Co., Ltd. used) was mixed as a thickener was used. This wiring material 11 is liquid at ordinary temperature, but is changed to a gelled state upon being heated. The "gelled state" used herein means such a state that when the wiring material 11 is fed to the transfer plate 15, the material exists in a liquid form, and the viscoelasticity of the material increases when the material is transferred onto the substrate, thereby producing a good pattern. Therefore, its use differs from as in a case of adding a gelling agent conventionally in printing and the like. The wiring material 11 which is liquid before being fed onto the transfer plate 15, can be coated onto the wiring pattern formed corresponding to an uneven surface of the transfer plate by utilizing the hydrophilic/hydrophobic property of the transfer plate 15. Thereafter, when the viscoelasticity of the wiring material 11 is increased, the wiring pattern can be maintained by attaching the wiring material 11 to the substrate 10 through the utilization of the adherence in transferring the wiring material 11 onto the substrate 10.

When the liquid wiring material 11 is fed onto the printing barrel roller 5, the wiring material 11 can be attached only to the hydrophilic portions 13 not to the hydrophobic portions 14 on the printing barrel roller 6. Consequently, the good wiring pattern can be formed on the substrate 10 in the transferring treatment.

The heater block 6 is installed inside the printing barrel roller 5 near a contacting portion between the substrate. The heater block 6 changes the viscosity of the wiring material 11 by heating in transferring the wiring material 11a from the printing barrel roller 5 onto the substrate 10 made of a preparatory glass for a microscope (In FIG. 1, the gelled wiring material is shown by a reference numeral 11a). The vicinity or the place of the printing barrel roller 5 where the heater block 6 is installed is heated to around 70° C.

The transfer stage 8 leads the substrate 10 to the printing barrel roller 5 for transferring the wiring pattern onto the substrate 10 and further leads the substrate 10 into the oven 9 after the wiring pattern is transferred with the printing barrel roller 5. Provided under the transfer stage 8 and near the printing barrel roller 5 is a heater block 7, which heats the substrate 10 from a bottom face side. The heater block 7 heats the transfer stage 8 such that the substrate 10 may reach a temperature high enough (80° in this embodiment) when the wiring material 11a is transferred thereonto.

The oven 9 heats the wiring pattern-transferred substrate 10 so that the wiring pattern may be fixed on the substrate 10.

Next, a process for forming the wiring pattern on the substrate 10 will be explained.

First, when the wiring material stored in the ink feed tank 2 is fed onto the kneading roller 3 via the feed opening 2a, the kneading roller 3 holds the wiring material 11 between the feed roller 4, spreads the wiring material 11 to a certain thickness, and feeds the resulting wiring material to the feed roller 4. The feed roller 4 further thinly spreads the wiring material 11 received thereon, and then feeds it to the printing barrel roller 5.

The wiring material 11 fed onto the printing barrel roller 5 is changed to a gelled state by heating with the heater block 6, thereby increasing the viscosity of the material. More specifically, the wiring material 11 is changed to the gelled state by heating through a phenomenon that cellulose-substituted portions in the Metrose are made hydrophobic intermolecularly to form crosslinked portions and lose the flowability thereof.

The gelled wiring material 11a is transferred onto the substrate at 80° C. running on the transfer stage 8 by the printing barrel roller 6. Since the transfer stage 8 is equipped with the heater block 7, the wiring material 11a heated with the heater block 6 maintains the increased viscosity even after being transferred onto the substrate 10. For this, the shape of the wiring pattern is stabilized on transferring, and the wiring material remaining on the printing barrel plate 15 can undergoes less change. Consequently, the continuity in the transfer treatment can be enhanced.

The substrate 11a on which the wiring material 11a is transferred is carried into the oven 9 by means of the transfer stage 8, and is then 6 heated and cured at 200° C. for 30 minutes, thereby forming the wiring pattern on the substrate 10.

As mentioned above, the shape-retaining property of the wiring pattern can be improved through increasing the viscosity of the wiring material 11 on transferring by using the wiring pattern-forming apparatus 1 according to the present invention. Particularly, when a curing agent is contained in the wiring material 11, the number of the crosslinking points can be increased by heating the wiring material 11. Thus, the shape of the wiring pattern can be easily retained. For example, when the wiring material 11 is of a low viscosity plate, the wiring pattern formed on the transfer plate can be prevented from being broken through the wiring material 11 being wet spread when being transferred onto the substrate 10.

When the aqueous solution of the soluble cellulose is mixed into the wiring material 11, the viscosity of the wiring material 11 can be increased by heating without mixing a special additive into the wiring material 11 or adding a specially treating step. When methyl cellulose, a protein or the like is used as the wiring material 11, the viscosity of the material can be similarly increased by thermally modifying it. Furthermore, since cellulose is good to the environment as the material, a load for the wiring pattern-forming apparatus can be reduced.

Particularly, when soluble cellulose is incorporated into the wiring material 11 as in the present invention, the material 11 is changed to the gelled state when it is heated to 50° or higher. When the wiring material 11 is fed onto the transfer plate 15 and then changed to the gelled state, the wiring pattern having good followability to the original fine wiring pattern can be formed, and the pattern shape can be then easily retained through the gelling when the pattern is transferred onto the substrate 10.

On the other hand, if the temperature of the wiring material 11 becomes too high, evaporation of a solvent in the wiring material 11 proceeds. If water is used as the solvent, it is feared that when the temperature exceeds around 70° C., water becomes highly volatile and that the shape of the pattern is broken on evaporation of water. Further, if the temperature is too high, water contained in the gelled wiring material 11a evaporates, so that the wiring material 11a becomes dry and may not be transferred onto the substrate. For this reason, the heating temperature for the wiring material 11a is preferably 50° C. to 70° C.

It is feared that the wiring material 11a gelled by heating decreases its viscosity on cooling to break the shape of the wiring pattern. Thus, it is preferable that the wiring material 11a transferred on the substrate 10 is dried or cured as it is in the gelled state. According to the present invention, the wiring pattern can be dried or cured by heating the substrate 10 with the heater block 7 installed, without the wiring pattern being broken.

Further, since the crosslinked points are formed by the chemical reaction in the wiring material 11a changed to the gelled state, such a material has an advantage in selection of the material as compared with a case where the gelled state is formed physically. As such a material undergoing the gelling reaction, there are known acrylamide, N, N'-methylene bisacrylamide, etc. which simultaneously undergo crosslinking and polymerization and polyvinyl alcohol, etc. which crosslinking polymer molecules. The polymerization or the reaction is carried out through the formation of radicals, utilization of light beams such as ultraviolet rays, utilization of a reaction with radioactive rays, utilization of other reaction with plasma or ions.

Further, since the transfer plate 15 is placed around the printing barrel roller 5, the contact area on transferring can be suppressed to a low level, so that a transferring gap can be easily controlled.

Furthermore, when the hydrophilic/hydrophobic pattern is formed on the transfer plate 15, the wiring material can be attached only to the hydrophilic portions 13 without being attached to the hydrophobic portions 14 through the utilization difference in water absorbability between them. Thus, the fine wiring pattern can be easily formed, while unevenness of the surface of the transfer plate 16 is being minimized.

Since the wiring material 11a is transferred onto the surface of the substrate 10 in the state that the viscosity of the wiring material 11a is high, the sectional shape of the wiring material 11a transferred onto the surface of the substrate 10 is in such a uneven form that the thickness of the wiring material is greater in side portions than that in the central portion. Thus, since the density of the current in a high frequency range is likely to be higher in peripheral portions of the wiring pattern in case of the above uneven sectional shape, rise in resistance can be reduced.

The wiring material 11 is not limited to the above-mentioned one, but wiring patterns can be similarly formed when Nanopaste manufactured by Harima Chemicals, Ltd. is used. When this material is used, it can be cured by heating at 250° C. for 1 hour. Further, the transfer plate 15 on which the wiring pattern is to be formed is not limited to the above-mentioned one, and a water-free transfer plate manufactured by Prestek Co., Ltd. or a hydrophilic/hydrophobic transfer plate may be effectively used as an equivalent of the above one. Furthermore, a flat plate, an anastatic plate or an engraved plate may be used as the transfer plate 15 so long as the plate can be placed around the printing barrel roller 5.

The use of the beater blocks 6 and 7 is not limited to the above-mentioned embodiment, which is merely one of examples. Similar effects can be exhibited by using a device other than the above-specified heater blocks so long as the wiring material can be directly or indirectly heated. For example, if the wiring material 11 contains a resin, it may be heated by a microwave heating system. If the printing barrel roller 5 is heated by using electromagnetically inductive heating, a ceramic heater or the like may be used. In addition, the wiring material may be heated by using infrared rays, light beams or laser beams.

The surface of the substrate 10 is preferably rough, because the wiring material 11a is more easily transferred onto the substrate 10. However, since the excess roughness leads to an increased thickness of the distributing line pattern correspondingly. Considering the thickness of the wiring, the surface roughness of the substrate is preferably not less than 10 nm and not more than 200 nm. Since the roughened surface of the substrate 10 gives an anchor effect that the wiring material 11a adheres to the substrate along depressions of the roughened surface, the adhesion of the wiring pattern can be enhanced.

Metal particles constituting the wiring material 11 are preferably not more than 100 nm, The decreased sizes of the metallic particles lead to an enlarged surface areas of the metallic particles and to occurrence of fusion bonding among the metallic particles at low temperatures. Particularly, if the particle size is not more than 100 nm, fusion bonding proceeds under heating condition at 150° C. to 250° C.

If the wiring material 11 is constituted by fine particles, resistance of grain boundaries existing among the particles may pose a problem. The particle size is preferably as large as possible. However, the particles having the average particle size of not more than 50 nm makes it difficult to ensure an appropriate thickness of the wiring and to sufficiently lower the resistance of the wiring. Further, if the average particle size is more than 300 nm, the particles are so large as to cause greater hollow portions and lower the density of the wiring. Thus, it is also difficult to lower the resistance of the wiring. Therefore, the arithmetically average particle size of the metallic particles constituting the wiring is preferably around 50 to 300 μm.

If the wiring material 11 is fed, in a solution form, onto the transfer plate 15 and the viscosity is high, there is a fear that the wiring pattern may be formed on the hydrophobic portions 14 through the adhesion of the wiring material 11 working or that the wiring pattern may be thick, thereby unfavorably decreasing the insulation of the wiring. For this reason, the viscosity of the wiring material 11 is preferably not more than 2 mPa-s when the wiring material 11 is transferred onto the transfer plate.

On the other hand, if the viscosity of the wiring material 11a transferred onto the substrate 10 is low, it is feared that the shape of the wiring pattern is broken to disenable the formation of the desired pattern. Particularly, if the surface of the substrate 10 is highly hydrophilic, there is the possibility that the wiring material 11a is wet spread. On the other hand, if the surface of the substrate 10 is highly hydrophobic, there occur many portions which repel the wiring material 11a, with the result that the wiring is broken or becomes conspicuously uniform in width or thickness. For this reason, the viscosity of the wiring material 11a is preferably not less than 1 mPa-s when the wiring material 11a is transferred onto the substrate 10.

The wiring material 11 to be used in the wiring pattern-forming apparatus is not limited to one to be used in the electric wiring, but this is employable in providing an optical wiring pattern on the substrate 10. The wiring is not limited to the metallic material even when the wiring material is applied to the electric wiring, and a semiconductor or insulating material may be employed. The semiconductor material may be used in an area where no impedance such as a resistor is not particularly required or such a semiconductor material may be used as a portion of a functional part. The insulating material can be used in the formation of the pattern for a location which is desired to be electrically isolated from a high-frequency waveguide.

Embodiment 2

Figure 2:
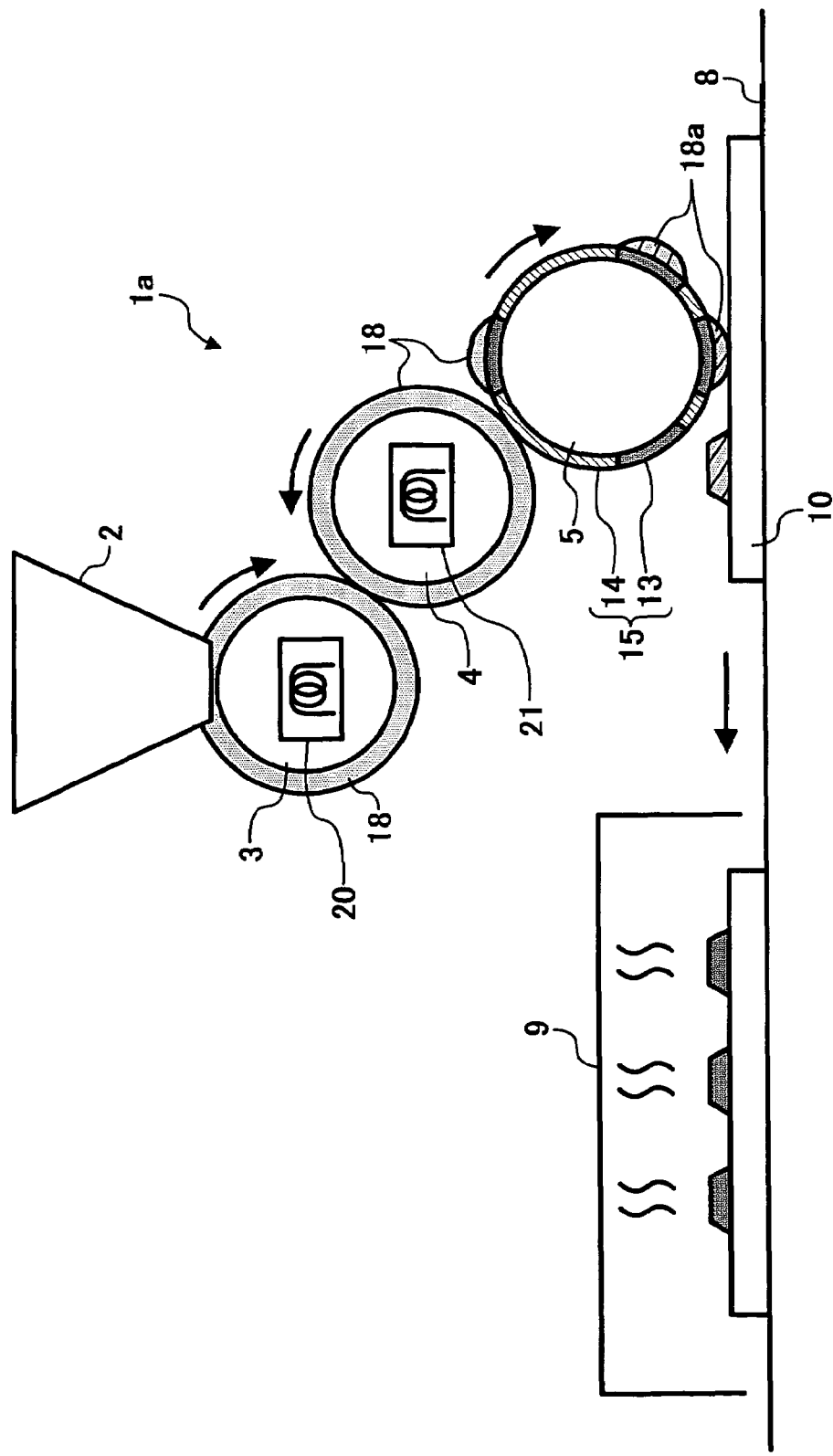
FIG. 2 is a schematic view showing the construction of a wiring pattern-forming apparatus used in Embodiment 2.

FIG. 2 is a construction of a second embodiment of the wiring pattern-forming apparatus according to the present invention.

Same reference numerals are given to those portions which have same constructions and functions as explained in Embodiment 1, and explanation on those portions is omitted. The wiring pattern-forming apparatus 1a in Embodiment 2 differs from that in Embodiment 1 in that neither the heater blocks 6 and 7 installed for the printing barrel roller 5 and the transfer stage 8, respectively are provided, and heater blocks 20 and 21 are arranged in a kneading roller 3 and a feed roller 4, respectively. Both the kneading roller 3 and the feed roller 4 are heated to 80° C. with the heater blocks 20 and 21, respectively.

A PET film is bonded to the printing barrel roller 5 as a transfer plate 15. In the PET film is formed a hydrophilic/hydrophobic pattern as in Embodiment 1. As a wiring material 18, 400 μl of a silver colloidal aqueous solution (Fine Sphinx SVW102 manufactured by Nippon Paint Co., Ltd.) into which 10 μl of a 10 wt % aqueous solution of a polyvinyl alcohol was mixed as a thickener was used.

When the wiring material 18 stored in the ink feed tank 2 is fed to the kneading roller 3 via a feed opening as in Embodiment 1, the kneading roller 3 holds and spreads the wiring material 18 into a certain thickness between the feed roller 4, and then feeds the material to the feed roller 4. The feed roller 4 further thinly spreads the wiring material 18 received, and then feeds it to the printing barrel roller 5. The wiring material 18 is heated to a liquid state with a lowered viscosity by the heater blocks 20 and 21 installed in the kneading roller 3 and the feed roller 4.

When the wiring material 18 is fed to the transfer plate 15, the material is cooled, since no heater block is installed for the printing barrel roller 5. The cooled wiring material 18 is changed to a gelled state through the formation of crosslinked points by hydrogen bonds between —OH groups and molecules of the polymer. As the materials which are changed to a physically gelled state through being cooled, natural polymers having numerous hydroxide groups, such as polysaccharides and proteins are known. Polyvinyl alcohol contained in the wiring material 18 used in Embodiment 2, agar, gelatin, etc. fall in such materials. Since the crosslinked points are formed by the hydrogen bonds through cooling in such a materials, the material can be changed to the gelled state through being cooled Thus, the viscosity of the wiring material 18 is lowered by heating during which the wiring material 18 is fed from the feed roller 4 to the printing barrel roller 5, whereas the material is rapidly gelled by cooling during which the material is transferred from the printing barrel roller 5 to the substrate, thereby preventing breakage of the wiring pattern.

After the transfer onto the substrate 10, it is necessary that the wiring material 18*a* gelled by cooling is subjected to evaporation as it is in the gelled state, thereby drying the material. For this, after the gelled wiring material 18*a* is transferred on the substrate 10, the material is dried to evaporate water, and it is cured after evaporation of water by heating the substrate in the oven 9 at 200° for around 30 minutes, thereby fixing the wiring pattern on the substrate 10.

As mentioned above, when the wiring material 18 is changed to the gelled state during the transfer of the wiring material 18 onto the substrate 10, the viscosity of the wiring material 18*a* is increased during the transfer to enhance the shape-retaining property of the wiring pattern, as in Embodiment 1.

Instead of using the evaporation treatment of the wiring material 18*a* as mentioned above, it may be that the temperature of the oven 9 is changed stepwise so that the wiring material is preliminarily baked and dried at 80° C. and cured by heating at 200° C. Similar treatment can be performed in case of an inline type oven in which a plurality of eaters are independently set at their optimal temperatures.

When a material composed of a paste clay having a low viscosity is used as the wiring material 18, the shape of a wiring pattern can be formed to follow the fine wiring pattern. For example, when hydrophilic portions 13 and hydrophobic portions 14 are formed at the transfer plate 15, it is preferable that the viscosity of the wiring material 18*a* is lowered so that the wiring material 18*a* may not remain on the hydrophobic portions 14 due to the adhesion of the material 18*a*. On the other hand, high flowability is required for the wiring material 18*a* during transferring. Since the wiring pattern-forming apparatus according to the present invention makes it possible to make the wiring material 18*a* have a high viscosity during transfer, the material needs to have tacking property.

Embodiment 3

Figure 3:
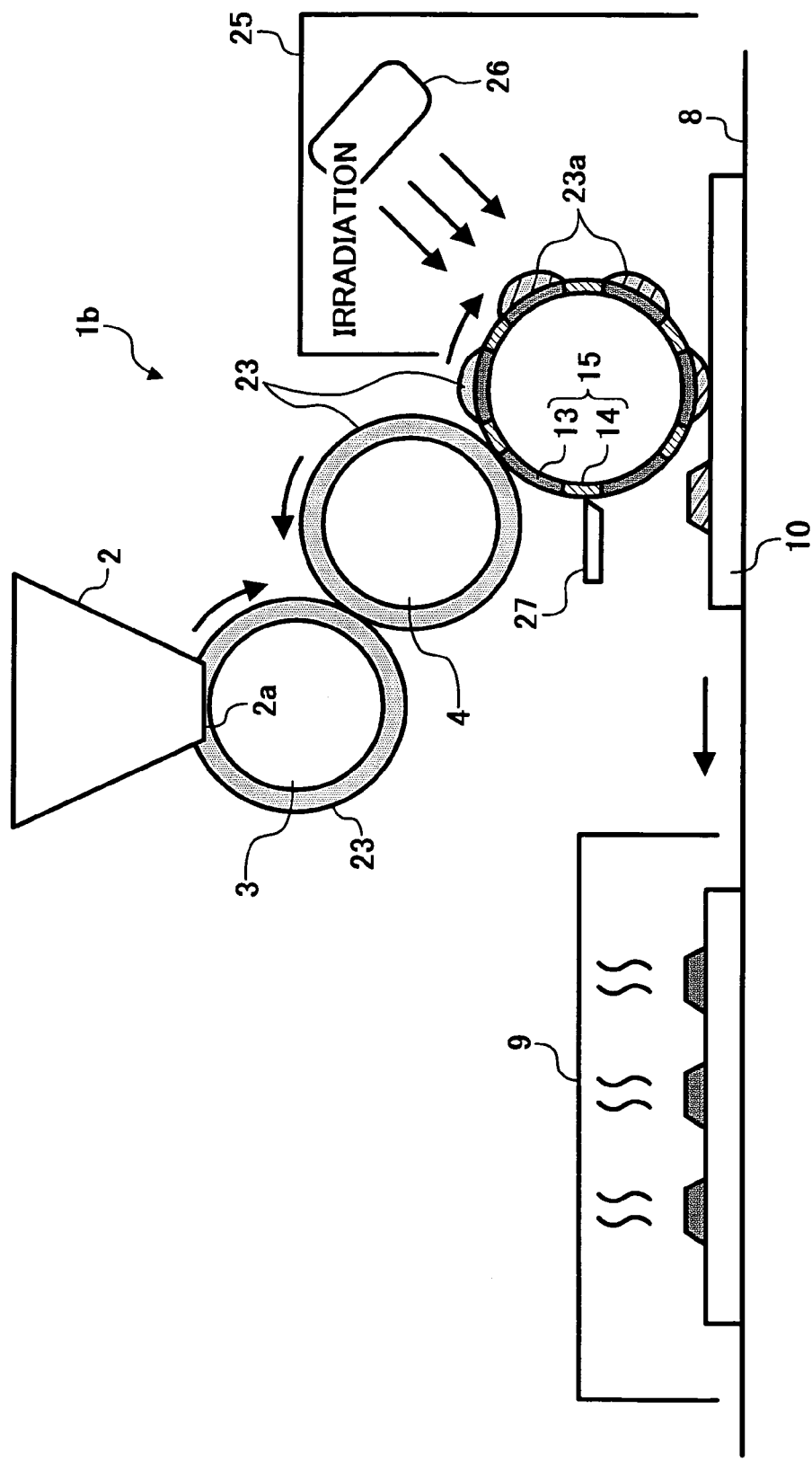
FIG. 3 is a schematic view showing the construction of a wiring pattern-forming apparatus used in Embodiment 3.

FIG. 3 shows a construction view of a third embodiment of the wiring pattern-forming apparatus according to the present invention.

Same reference numerals are given to those portions which have same constructions and functions as explained in Embodiments 1 and 2, and explanation on those portions is omitted. The wiring pattern-forming apparatus 1*b* in Embodiment 3 differs from that in Embodiment 1 in that neither the heater blocks 6 and 7 installed for the printing barrel roller 6 and the transfer stage 8, respectively are provided, and that a light-shielding casing 25, a low-pressure mercury lamp 26 and a doctor blade 27 are arranged for a wiring material 23 fed to the printing barrel roller 5.

A PET film was bonded to the printing barrel roller 5 as a transfer plate 15. The PET film was formed with a hydrophilic/hydrophobic pattern as in Embodiment 1. As a wiring material 23, 40 ml of a silver colloidal aqueous solution (Fine Sphinx SVW102 manufactured by Nippon Paint Co., Ltd.) into which 10 mg of acrylamide and 1 mg of N, N'-methylene bisacrylamide were nixed was used. The wiring material 23 was charged in the ink reed tank 2. The wiring material 23 charged in the ink feed tank 2 is sent to the printing barrel roller 5 as in the same way in Embodiment 1. A part of the printing barrel roller 6 is shield from light with the light-shielding casing 25. The wiring material 23 transferred into the light-shielding casing 25 is irradiated with ultraviolet rays having an irradiation wavelength of 0.254 µm generated from the low-pressure mercury lamp 26. The light-shielding casing 25 prevents the ultraviolet rays of the low-pressure mercury lamp 26 from leaking outsides. The wiring material 23 is changed to a gelled state upon receipt of the ultraviolet rays. The wiring material 23 moving inside the light-shielding casing 25 through rotation of the printing barrel roller 5 is gelled upon receipt of the ultraviolet rays, and then transferred onto the substrate 10. The wiring material 23*a* transferred onto the substrate 10 is heated and fixedly cured on the substrate at 200° C. in the oven for 30 minutes.

In this way, when the wiring material 23 which changes its viscosity through irradiation of light such as ultraviolet rays is used to be transferred onto the substrate 10, the wiring material 23 can be easily transferred onto the substrate 10 as in the same way in Embodiments 1 and 2. Since the wiring material 23*a* can be subjected to evaporation treatment by heating the substrate immediately after transferring, the shape-retaining property of the wiring pattern can be enhanced.

According to the wiring pattern-forming apparatus 1*b*, since it is feared that the wiring material 23 is changed to a gelled state with external light, the above treatment may be performed, while such light is sufficiently shielded by housing the ink feed tank 2, the kneading roller 5 and the feed roller 4 in the light-shielding casing. By so doing, the wiring material 23 can be prevented from being gelled with the external light.

Since the above gelling reaction of the wiring material 23 irreversibly occurs, the amount of the gelled material increases with lapse of use time. Consequently, there rises a problem that the shape of the wiring pattern may be broken or the viscosity of the wiring material may excessively increase. Such a problem can be solved by provide a doctor blade 27 at a location downstream the transfer site onto the substrate 10 which doctor blade removes excess ink on the transfer plate 15.

Embodiment 4

Figure 4:
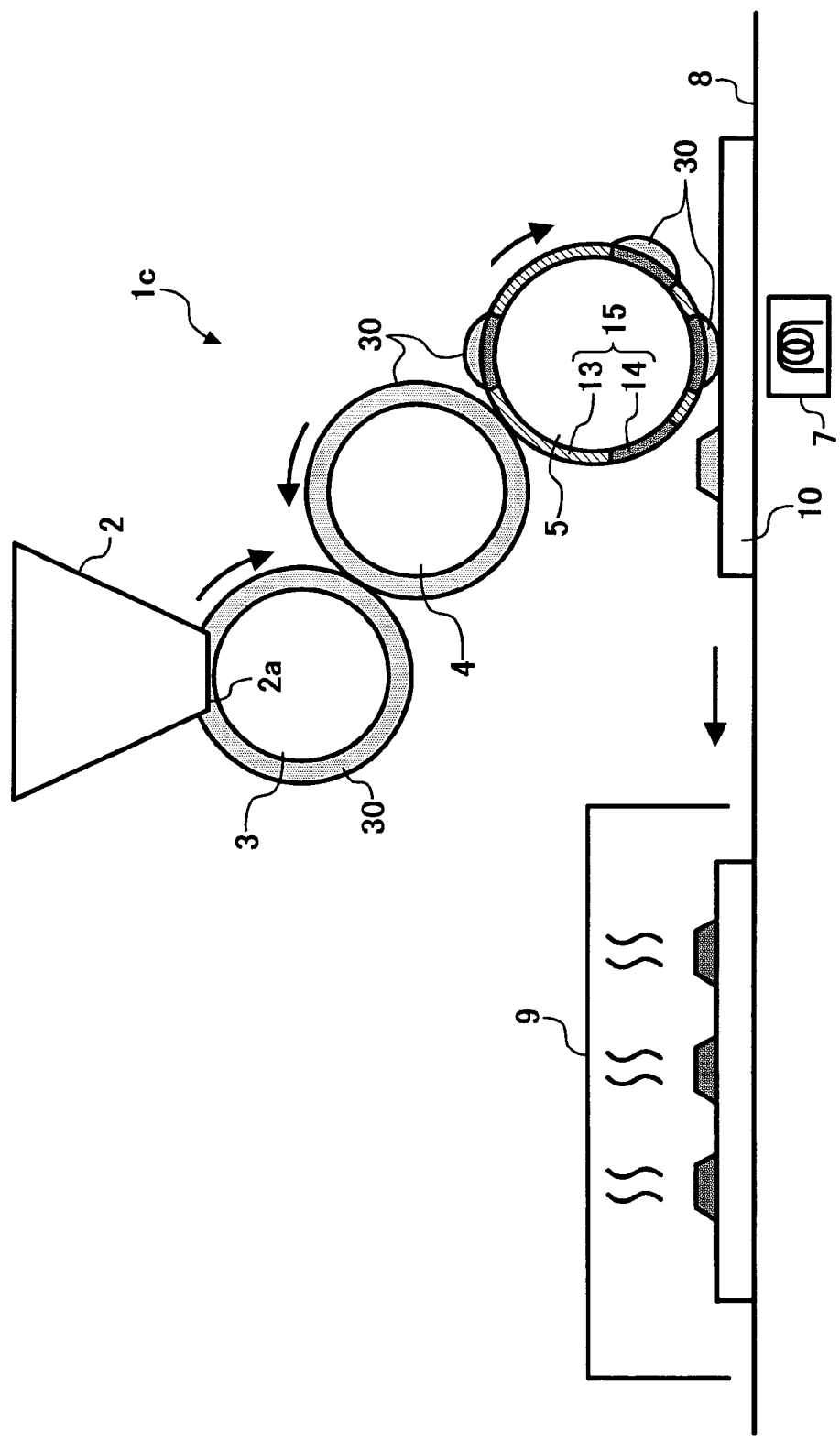
FIG. 4 is a schematic view showing the construction of a wiring pattern-forming apparatus used in Embodiment 4.
Figure 5:
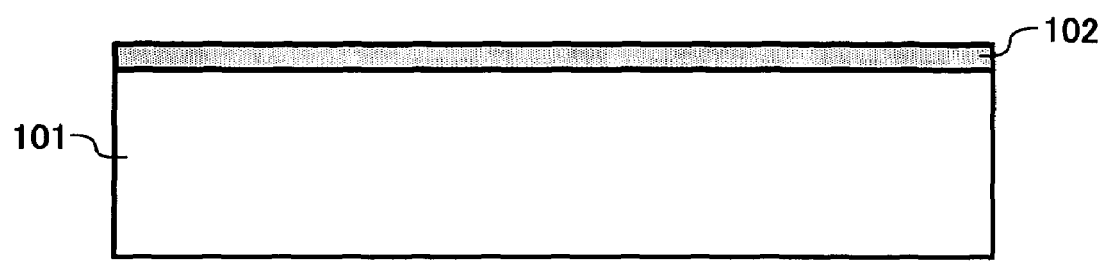
FIG. 5 is a schematic view showing a support on which a viscosity-increasing layer is formed.

FIG. 4 is a constructional view of a fourth embodiment of the wiring pattern-forming apparatus according to the present invention.

Same reference numerals are given to those portions which have same constructions and functions as explained in Embodiments 1 to 3, and explanation on those portions is omitted. The wiring pattern-forming apparatus 1*c* according to Embodiment 4 is identical with that 1 explained in Embodiment 1 except that the heater block 6 installed for the printing barrel roller 5 is removed.

A PET film was bonded to the printing barrel roller 5. In the PET film is formed a hydrophilic/hydrophobic pattern as in Embodiment 1. As a wiring material 30, 400 µl of a silver colloidal aqueous solution (Fine Sphinx SVW102 manufactured by Nippon Paint Co., Ltd.) was used. The wring material 30 was charged into the ink feed tank 2, and the wiring material 30 was fed onto the printing barrel roller as in Embodiment 1.

In the transfer stage 8 is provided a heater block 7 near a location where the wiring material 30 is transferred from the printing barrel roller 5 to the substrate 10, and the substrate 10 is heated to around 70° C. by the heater block 7 before the material is transferred onto the substrate. When the wiring material 30 contacts the surface of the substrate 10, water as solvent in the wiring material 30 is simultaneously evaporated, and only nanometer-order silver particles are attached onto the substrate 10. Thereafter, the substrate attached with the nanometer-order silver particles is heated for around 30 minutes in the oven 9 heated to 200° C., thereby fixedly curing the wiring pattern on the substrate 10.

When the wire pattern-forming apparatus 1c in Embodiment 4 is used in this manner, the wiring material 30 can be easily transferred to the substrate 10 in the same manner as in Embodiments 1 to 3. The shape-retaining property of the wiring pattern can be enhanced by evaporating the solvent in the wiring material 30 on transferring.

The heater block 7 needs not necessarily provided in the transfer stage 8, and the solvent in the wiring material 30 has only to be evaporated upon contact with the substrate 10. Therefore, when the substrate is sufficiently heated before it is transferred with the transfer stage 8, similar effects can be exhibited.

When the wiring material 30 was transferred onto the substrate 10 heated at a temperature of 30° C., nanometer-order particles could not be attached onto the substrate 10. When the substrate 10 was heated to 90° C., water rapidly evaporated, so that the shape of the pattern transferred on the substrate 10 was broken and no good wiring pattern was obtained.

As mentioned above, the viscosity of the wiring material when the material is fed from the material feeder to the transfer plate is made different from that or the wiring material when the material is transferred from the transfer plate to the substrate, by using the wiring pattern-forming apparatus and the wiring pattern-forming method according to the present invention. Thus, when the wiring material is the low-viscosity paste, the material can be easily transferred onto the substrate by increasing the viscosity of the wiring material on transferring. On the other hand, when the wiring material is the high-viscosity paste, the material can be easily transferred onto the substrate by decreasing the viscosity of the wiring material on transferring.

Particularly, the viscoelasticity of the wiring material is increased by changing the wiring material to the gelled state on increasing the viscosity, so that the shape-retaining property of the wiring pattern on the substrate onto which the wiring material is transferred is enhanced. The viscosity of the wiring material can be increased by heating or cooling it, without adding a special additive or performing special treatment. Thus, the transfer process can be easily performed by using the wiring pattern-forming apparatus having the simplified construction.

When the viscosity of the wiring material is increased by cooling it with the energy feeder, it is possible that the wiring material is transferred onto the substrate after its viscosity is decreased by heating and that the wiring material is rapidly cooled on the substrate to speedily gel it and to prevent the breakage of the wiring pattern.

When the viscosity of the wiring material is increased by cooling it with the energy feeder, the wiring material is transferred onto the substrate after decreasing the viscosity of the material by heating, rapidly cooled on the substrate and rapidly gelled, thereby preventing breakage of the wiring pattern.

When the soluble cellulose is mixed into the wiring material, the viscosity of the wiring material can be easily increased by heating, and the material is good to the environment. Thus, the load can be lessened for the wiring pattern-forming apparatus, When the temperature of the transferring plate is raised by heating the transfer plate, the viscosity of the wiring material is increased on transferring by changing the wiring material on the transfer plate to the gelled state. Consequently, the wiring material of the wiring pattern formed on the transfer plate can be easily transferred, while the shape of the wiring pattern is maintained. Particularly when the wiring material is heated to a temperature of 50° C. to 70° C., the pattern shape is unlikely to be broken. Further, when the viscosity of the wiring material transferred on the substrate is increased by heating the substrate, the shape of the wiring pattern on the substrate can be stably maintained. Further, since the amount of the wiring material remaining on the transfer plate can be varied, the continuity of the transfer process can be enhanced. Furthermore, when the wiring material transferred onto the substrate is solidified with heat from the substrate, the shape of the wiring pattern can be easily maintained on the substrate by curing the wiring material immediately after transferring it on the substrate.

When the material which is changed to the gelled state by crosslinking through the chemical reaction is used as the wiring material, the selectivity of the material can be widened. Further, when the wiring material is crosslinked by utilizing the photo reaction/polymerization, the wiring material can be easily gelled during the transfer step.

When transfer plate is placed around the outer periphery of the cylindrical roller, the contact area between the transfer plate and the substrate during transfer can be suppress to a lower level, so that the transfer gap can be easily controlled. Further, when the wiring pattern of the transfer plate is constituted by the hydrophilic portions and the hydrophobic portions and the wiring material is fed to the transfer plate by the wiring material feeder, the transfer process can be performed by attaching the wiring material only to the hydrophilic portions. Therefore, the unevenness of the surface of the printing plate can be reduced to form the fine wiring pattern.

Referring to drawings (FIGS. 5 to 14), explanation will be made on examples of the methods for producing electronic devices such as wiring substrates having high-precision electrically conductive wiring patterns by a printing/transferring technique without using a photo process or an etching process as well as electronic devices produced by such producing methods.

EXAMPLE 101

First, Example 101 will be explained with reference to FIGS. 7(A) to 7(C).

A method for producing a wiring substrate in Example 101 comprises the following steps (1) to (4).

(1) A 4% aqueous solution of water-soluble cellulose (Metrose manufactured by Shin-Etsu Chemical Co., Ltd.) was coated onto a support 101 made of glass. The coated support was dried to form a viscosity-increasing layer 102 of a water-soluble polymer in a thickness of 0.4 to 0.8 „m, thereby producing a wiring pattern-forming substrate.

Figure 7A:
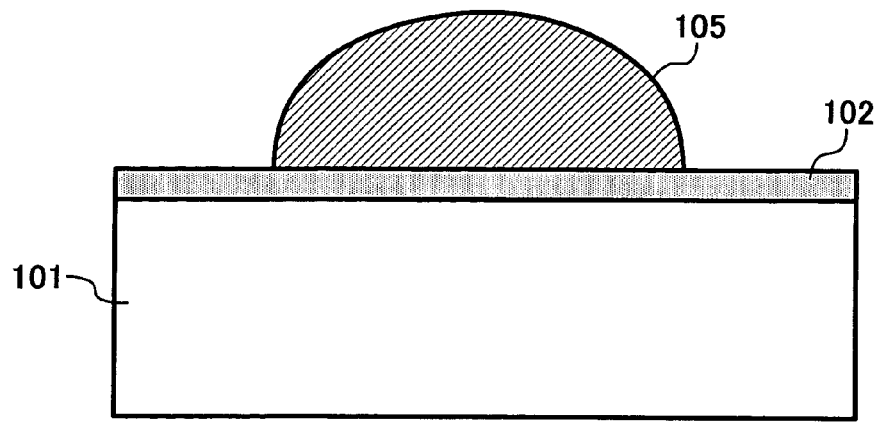
FIGS. 7(A) to 7(C) are schematic views showing a process for producing the wiring substrate shown in FIG. 6.

(2) After a pattern of an aqueous electrically conductive ink (Nippon Paint Co., Ltd.) was formed on a plate on which a pattern was formed based upon difference in wettability, the pattern of the electrically conductive ink was printed (transferred) onto the viscosity-increasing layer 102 (water-soluble cellulose) of the wiring pattern-forming substrate, thereby forming a given pattern 105 of the electrically conductive ink (FIG. 7(A)).

Figure 7B:
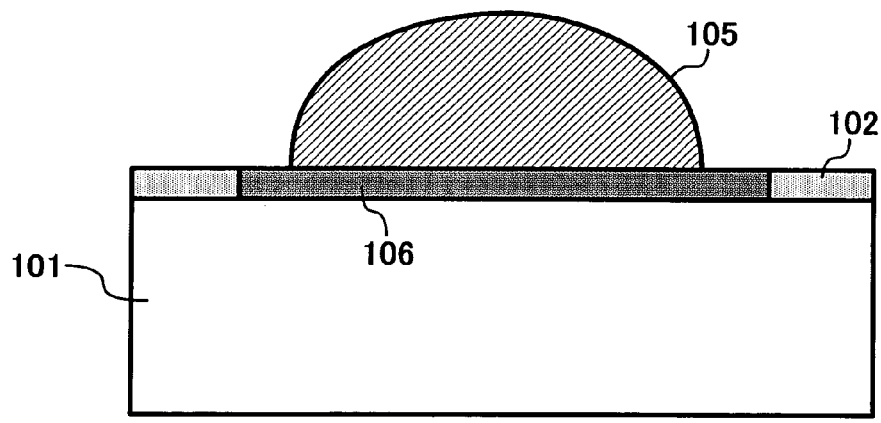

(3) The viscosity of a contacting portion between the aqueous, electrically conductive ink and the water-soluble cellulose is increased through cellulose dissolving into the conductive ink (viscosity-increased portion 106), which can prevent disturbance of the shape of the pattern (FIG. 7(B)). At that time, heating is effective to promote evaporation of water and control of dissolution of cellulose.

Figure 7C:
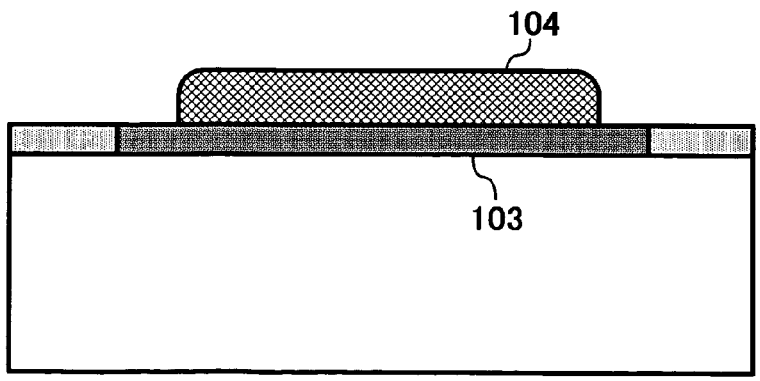

(4) By curing the ink at 150° C. for 30 minutes (fusion bonding nanometer-order metal particles) an electrically conductive wiring pattern is formed on the wiring pattern-forming substrate (FIG. 7(C)).

As the water-soluble resin (polymer), polyvinyl alcohol, polyvinyl pyrrolidone, etc. are effective in addition to water-soluble resin.

Figure 6:
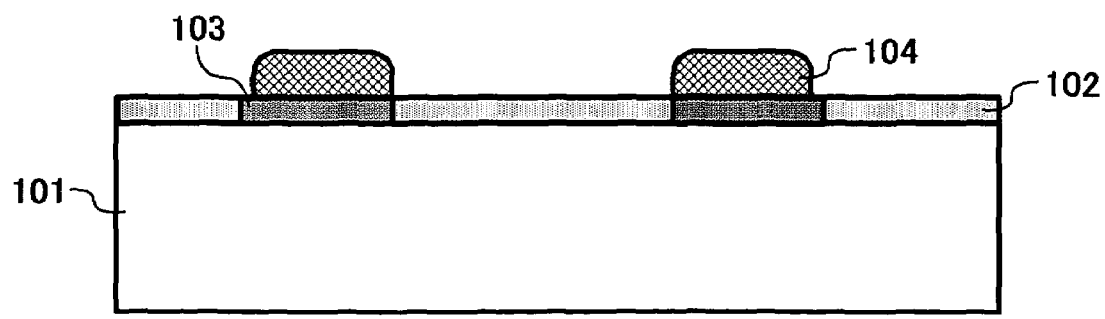
FIG. 6 is a schematic view showing a wiring substrate in which an electrically conductive wiring pattern is formed on the viscosity-increasing layer of the support.

The wiring substrate produced by the method of Example 101, which is shown in FIGS. 6 and 7(C), has the following construction.

The wiring pattern-forming substrate is constructed by forming the viscosity-increasing layer made of the water-soluble polymer on the support 101. On the viscosity-increasing layer 102 is formed the given electrically conductive wiring pattern 4 in which the fine metallic particles are mutually fusion bonded together. A holding layer 103 made of a mixture of the fine metallic particles and the polymer is formed under the electrically conductive wiring pattern.

EXAMPLE 102

Example 102 will be explained with reference to FIG. 8.

A producing method in Example 102 is fundamentally similar to that in Example 101, and comprises the following steps (1) to (4).

(1) A 4% aqueous solution of water-soluble cellulose (Metrose manufactured by Shin-Etsu Chemical Co., Ltd.) was coated onto a support 101 made of glass. The coated support was dried to form a viscosity-increasing layer 102 of a water soluble polymer in a thickness of 0.4 to 0.8„m, thereby producing a wiring pattern-forming substrate.

(2) After a pattern of an aqueous electrically conductive ink (Nippon Paint Co., Ltd.) into which was dissolved 0.1 to 1% of a compound having 2 or more functional groups reactive with OH groups was formed on a plate on which a pattern was formed based upon difference in wettability, the pattern of the electrically conductive ink was printed (transferred) onto the viscosity-increasing layer 102 (water-soluble cellulose) of the wiring pattern-forming substrate, thereby forming a given pattern.

(3) The "electrically conductive ink" used herein is an ink in which electrically conductive fine particles having particle sizes of not more than 50 nm are dispersed in an aqueous solvent together with a polymer for preventing flocculation.

As a crosslinking agent hereinafter, urea-formalin resin, methylol melamine resin, glyoxal, tannic acid, etc. may be recited. More specifically, into the ink were added 0.1% of a methylol melamine resin (Sumitex Resin M-3: Sumitomo Chemical Co., Ltd.) as a crosslinking agent and a catalyst (Sumitax Accelerator: Sumitomo Chemical Co., Ltd.) which was in an amount of 10% relative to the crosslinking agent. After the printing of the pattern, it wars cured at 105° for 2 hours, and a non-dissolved portion 108 was formed by insolubilizing a portion under the pattern.

(4) Thereafter, the ink was hardened at 150° for 30 minutes, thereby forming an electrically conductive wiring pattern 104 on the wiring pattern-forming substrate.

Figure 8:
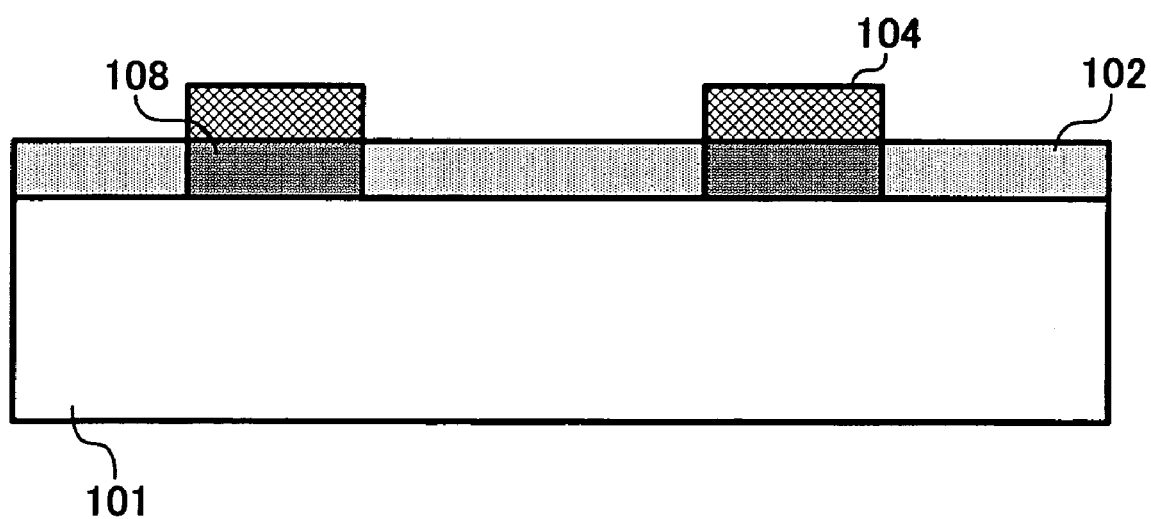
FIG. 8 is a schematic view showing a wiring substrate in which portions of the viscosity-increasing layer under the electrically conductive wiring pattern are insolubilized.

The wiring substrate produced by the producing method of above Example 102, which is shown in FIG. 8, comprises the following construction.

The wiring pattern-forming substrate is produced by forming The viscosity-increasing layer 102 made of the water-soluble polymer on the support 101. A given pattern of the electrically conductive wiring is formed on the viscosity-increasing layer, and the non-dissolved portion 108 in which the viscosity-increasing layer is insolubilized is formed under the electrically conductive wiring pattern 104.

EXAMPLE 103

Figure 9A:
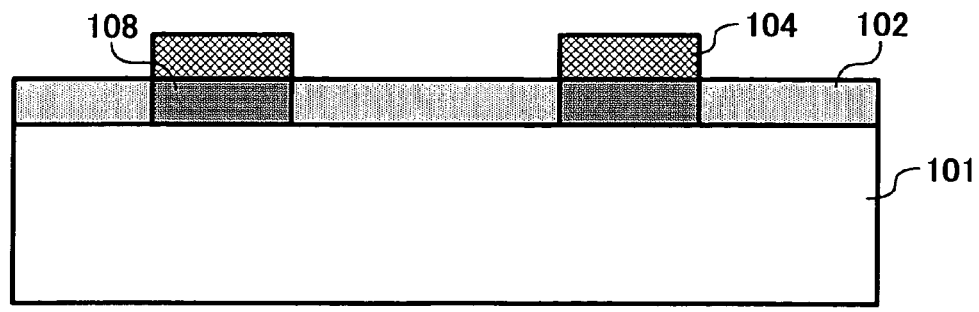
FIGS. 9(A) to 9(C) are schematic views showing a process for insolubilizing the entire viscosity-increasing layer of the wiring substrate shown in FIG. 8.

Next, Example 103 will be explained with reference to FIGS. 9(A) to 9(C).

A producing method in Example 103 is fundamentally similar to that in Example 102, and comprises the following steps (1) to (5).

(1) to (4) These steps are the same as those in Example 102. See FIG. 9(A).

Figure 9B:
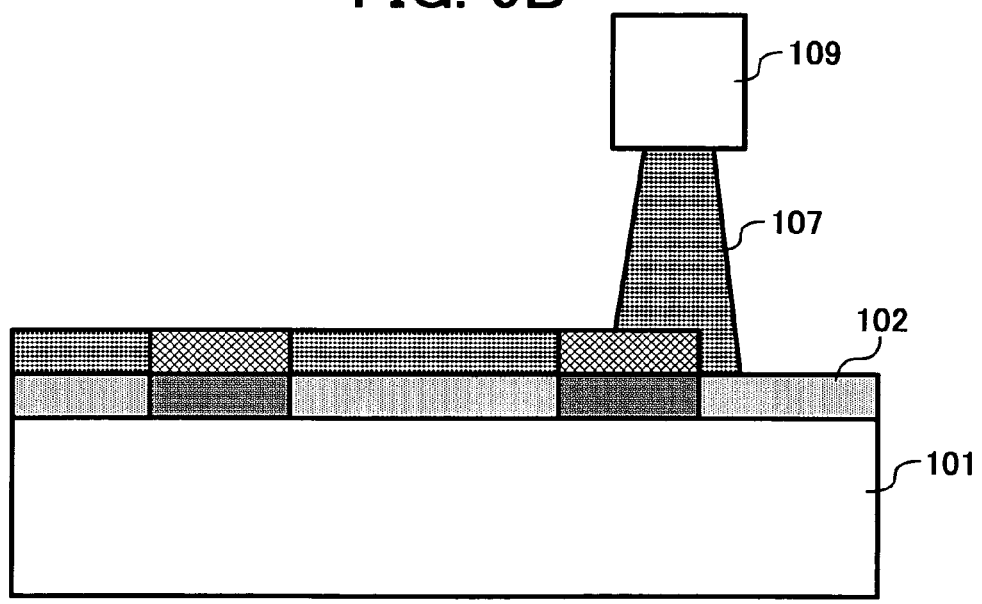

(5) Finally, an insolubilizing solution 107 containing the crosslinking agent and the catalyst mentioned above was coated onto the entire surface by using a coating means 109 (FIG. 9(B)), and the resultant was subjected to curing at 105° for 2 hours, thereby entirely insolubilizing the viscosity-increasing layer and forming an non-dissolved layer 110. See FIG. 9(C).

Figure 9C:
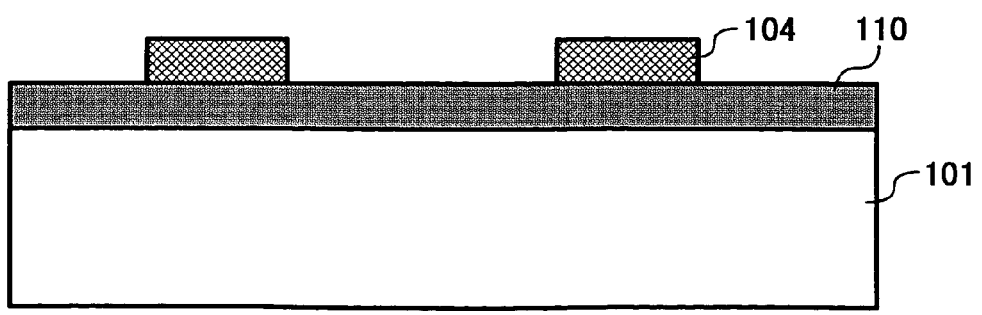

The wiring substrate produced by the producing method of the above Example 103, which is shown in FIG. 9(C), comprises the following construction.

In the wiring pattern-forming substrate, the non-dissolved layer produced by insolubilizing viscosity-increasing layer 102 is formed on the support 101. A given pattern 104 of the electrically conductive wiring is formed on the non-dissolved layer 110.

EXAMPLE 104

Example 104 will be explained with reference to FIG. 10.

A producing method in Example 4 is fundamentally similar to that in Example 102, and comprises the following steps (1) to (4).

(1) A 4% aqueous solution of water-soluble cellulose (Metrose manufactured by Shin-Etsu Chemical Co., Ltd.) was coated onto a 30 „m-thick Teflon® film (Teflon substrate) heated to not less than a thermally gelling temperature of the water-soluble cellulose (55 to 70° C.). The water-soluble cellulose was gelled to prevent the formation of a non-uniform coated film due to water-repellent property of the Teflon film. Thereafter, the coated film was dried to form a viscosity-increasing layer being the water-soluble polymer layer in a thickness of 0.4 to 0.8„m, thereby producing a wiring pattern-forming sheet.

(2) After a pattern of an aqueous electrically conductive ink (Nippon Paint Co., Ltd.) into which was dissolved 0.1 to 1% of a compound having 2 or more functional groups reactive with OH groups was formed on a plate on which a pattern was formed based upon difference in wettability, the pattern of the electrically conductive ink was printed (transferred) onto the viscosity-increasing layer (water-soluble cellulose) of the wiring pattern-forming substrate, thereby forming a given pattern.

(3) As a crosslinking agent, urea-formalin resin, methylol melamine resin, glyoxal, tannic acid, etc. may be recited. More specifically, into the ink were added 0.1% of a methylol melamine resin (Sumitex Resin M-3: Sumitomo Chemical Co., Ltd.) as a crosslinking agent and a catalyst (Sumitax Accelerator: Sumitomo Chemical Co., Ltd.) which was in an amount of 10% relative to the crosslinking agent. After the printing of the pattern, it was cured at 105° for 2 hours, and a non-dissolved portion 108 was formed by insolubilizing a portion under the pattern.

(4) Thereafter, the ink was hardened at 150° for 30 minutes, thereby forming an electrically conductive wiring pattern on the wiring pattern-forming substrate.

If an electrically conductive ink containing no crosslinking agent is used in parallel and printing is effected with two kinds of the inks, the portion under the wiring pattern can be selectively insolubilized.

Figure 10:
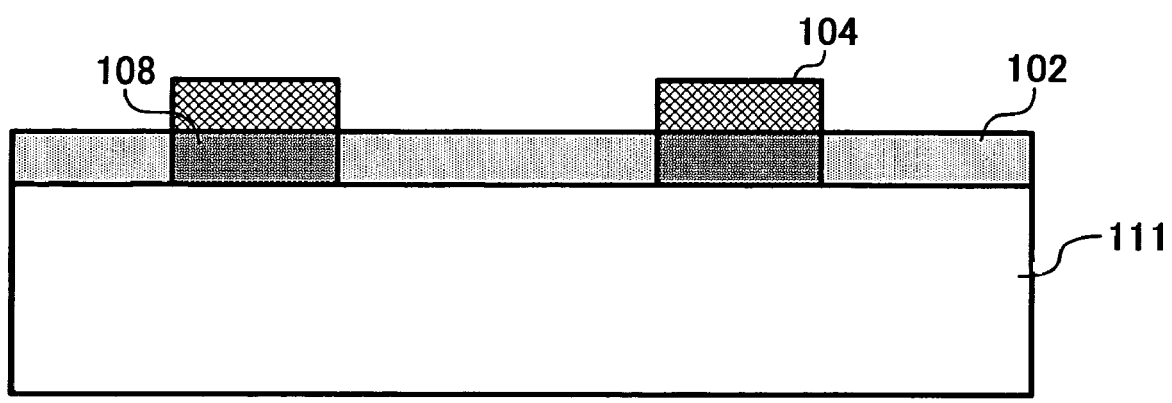
FIG. 10 is a schematic view showing a wiring pattern-transferring sheet in which an electrically conductive wiring pattern is formed on a support made of a releasability-exhibiting material.

The wiring substrate produced by the producing method of above Example 104, which is shown in FIG. 10, comprises the following construction.

In the wiring pattern-forming sheet, the viscosity-increasing layer 102 is formed on the support 111 made of Teflon film. A given pattern 104 of the electrically conductive wiring is formed on the viscosity-increasing layer 102, and the non-dissolved portion 108 in which the viscosity-increasing layer is insolubilized is formed under the electrically conductive wiring pattern 104.

EXAMPLE 105

Example 105 will be explained with reference to FIGS. 11(A) to 11(D) and FIG. 12.

According to a producing method of Example 105, a wiring substrate is produced by bonding the wiring pattern-transferring sheet produced by the method of the above Example 104 to a substrate on which a wiring pattern is to be transferred. The Producing method of Example 105 comprises the following steps (1) to (4).

(1) An adhesive layer 122 is formed on a substrate 121 on which a wiring pattern is to be transferred. See FIG. 11(A).

(2) The wiring pattern-transferring sheet is bonded to the substrate 121 with the adhesive, and they are bonded together by heating and pressing with a heating/pressing means 130. See FIG. 11(B).

(3) The support 111 being the Teflon film as the wiring pattern-transferring sheet is peeled, and the viscosity-increasing layer 102 being the water-soluble film is washed and dissolved with water by means of a washer 131, thereby removing the viscosity-increasing layer. See FIG. 11(C).

(4) A wiring substrate is completed by transferring the electrically conductive wiring pattern 104 onto the substrate 121. Since insolubilized portions of the viscosity-increasing layer 102 is not removed by washing with water, those portions remain as a protective layer for the electrically conductive wiring pattern 104. See FIG. 11(D).

Further, according to the above producing process, even if the substrate 121 has a surface constituted by a curved surface or a plurality of flat faces, the electrically conductive wiring pattern 104 can be formed on that surface of the substrate at a high accuracy. In case the substrate 121 has such a curved surface or the like, heating and pressing with a roller is effective. See FIG. 12.

As the adhesive, thermosetting adhesive, thermoplastic adhesive, UV-curable adhesive, etc. may be used, but the adhesive is not limited to them. The invention encompasses a case where the transferring surface of the substrate itself has a wiring pattern-holding function. This corresponds to a case where the substrate is made of a thermoplastic resin material.

The wiring substrate produced by the producing method of the above Example 105 is shown in FIG. 7(D) and FIG. 8, and has the following construction.

A given pattern 4 of the electrically conductive wiring is formed on the substrate 21 on which the adhesive layer 22 is formed, and the non-dissolved portions 8 in which the viscosity-increasing layer is insolubilized are formed on the electrically conductive wiring pattern 4.

EXAMPLE 106

Example 106 will be explained with reference to FIG. 13.

According to the producing method in Example 106, a wiring pattern-transferring sheet is produced by forming an organic semiconductor layer 112 on the wiring pattern-transferring sheet produced by the above Example 104. The producing method in Example 106 comprise the following steps (1) to (5).

(1) to (4) Steps (1) to (4) are the same as those in the above Example 104.

(5) An organic semiconductor layer 112 is formed on the electrically conductive wiring pattern 4 (corresponding to a gate electrode) of the wiring pattern-transferring sheet produced by the producing method of Example 104.

The semiconductor layer is formed by coating a polythiophene on the sheet, and treating it at 100 to 250° C. For the electrically conductive wiring pattern 104 being a conductor (gate electrode), an electrically conductive polymer such as PPV (polyphenylene vinylene) or PEDOT (polythiophene) may be used.

The wiring pattern-transferring sheet produced by the producing method of the above Example 106 is shown in FIG. 13, and has the following construction.

The wiring pattern-forming sheet is constructed by forming the viscosity-increasing layer 102 on the support 111 made of Teflon or the like. A given pattern 104 of the electrically conductive wiring is formed on the viscosity-increasing layer 102, and the non-dissolved portion 108 in which the viscosity-increasing layer 102 is insolubilized is formed under the electrically conductive wiring pattern 104. Further, the organic semiconductor layer 112 is formed on the electrically conductive wiring pattern 104.

EXAMPLE 107

Figure 14A:
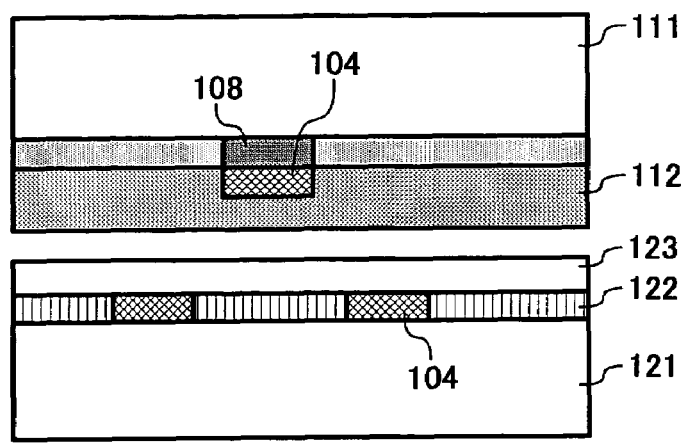
FIGS. 14(A) to 14(C) are schematic views showing a process for producing a transistor by joining a wiring substrate to a wiring pattern-transferring sheet.
Figure 14B:
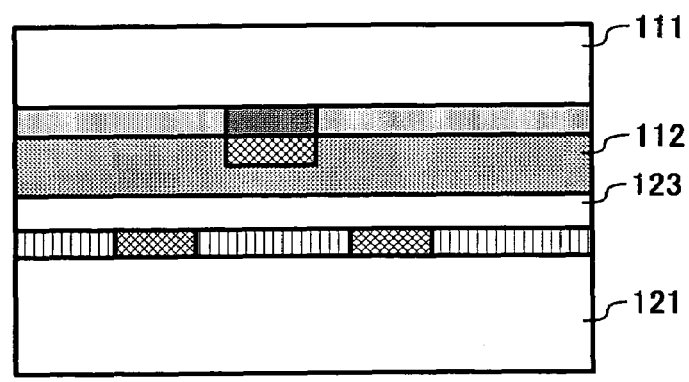

Example 107 will be explained with reference to FIG. 14(A) to FIG. 14(C).

According to the producing method or Example 107, a transistor is formed by joining the wiring substrate produced by the producing method of the above Example 105 to the wiring pattern-transferring sheet produced by the producing method of the above Example 106. The producing method of Example 107 has the following steps (1) to (4).

Figure 11A:
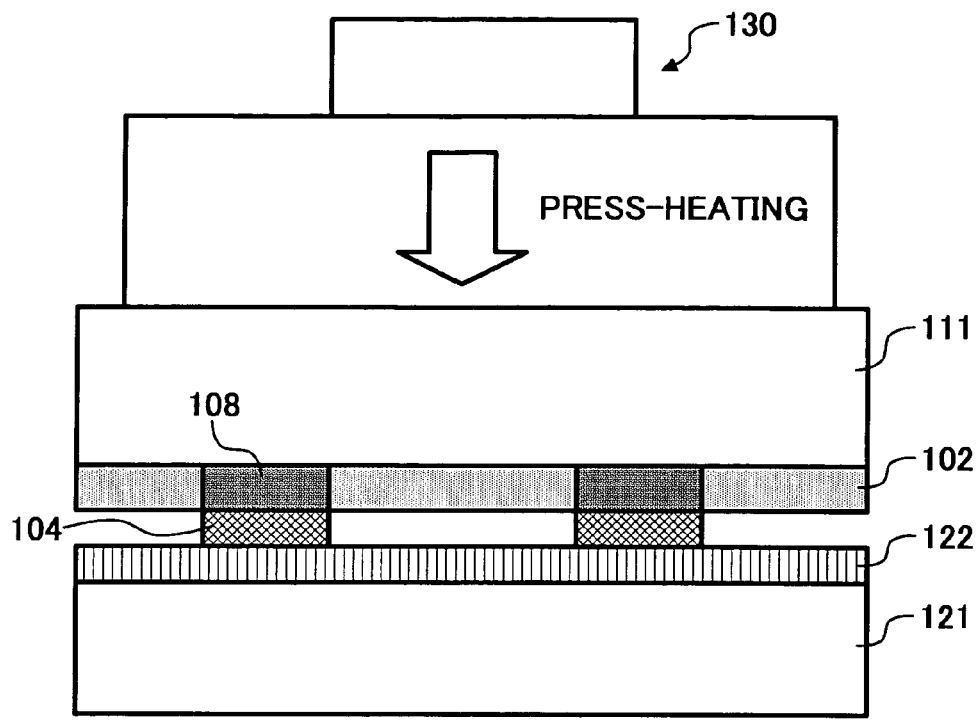
FIGS. 11(A) to 11(D) are schematic views showing a process for producing a wiring pattern-formed substrate by bonding the wiring pattern-transferring heat shown in FIG. 10 to a substrate.
Figure 11B:
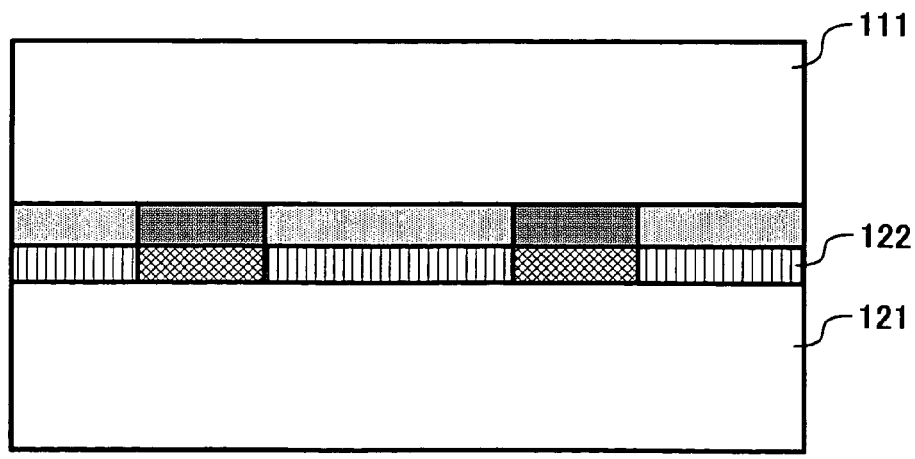
Figure 11C:
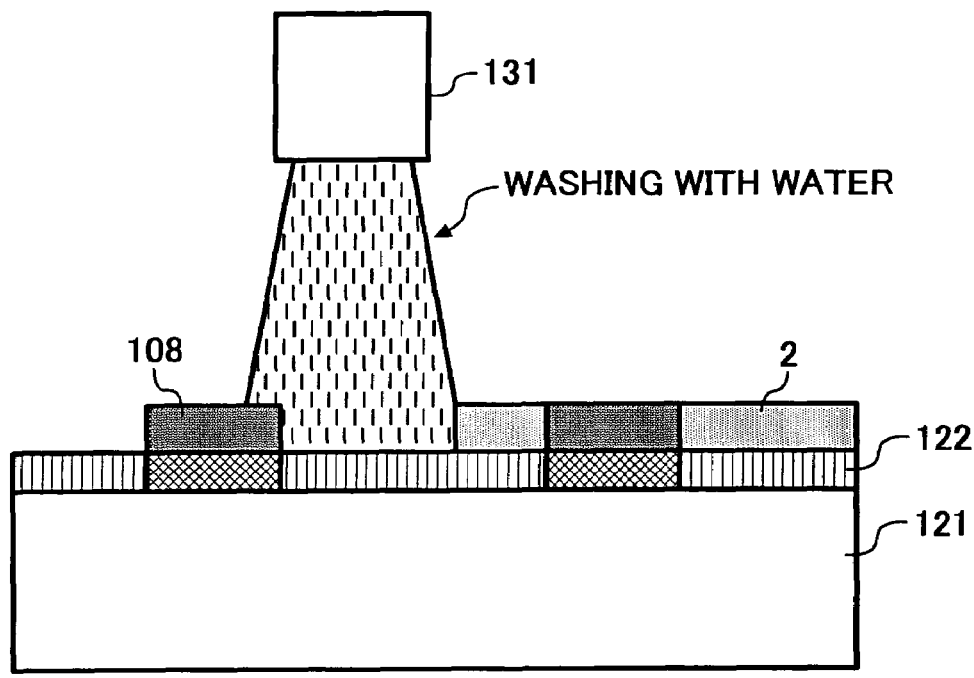
Figure 11D:
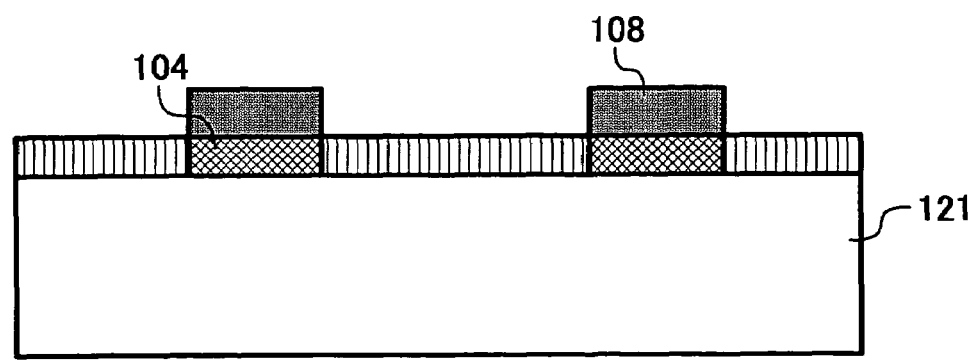
Figure 12:
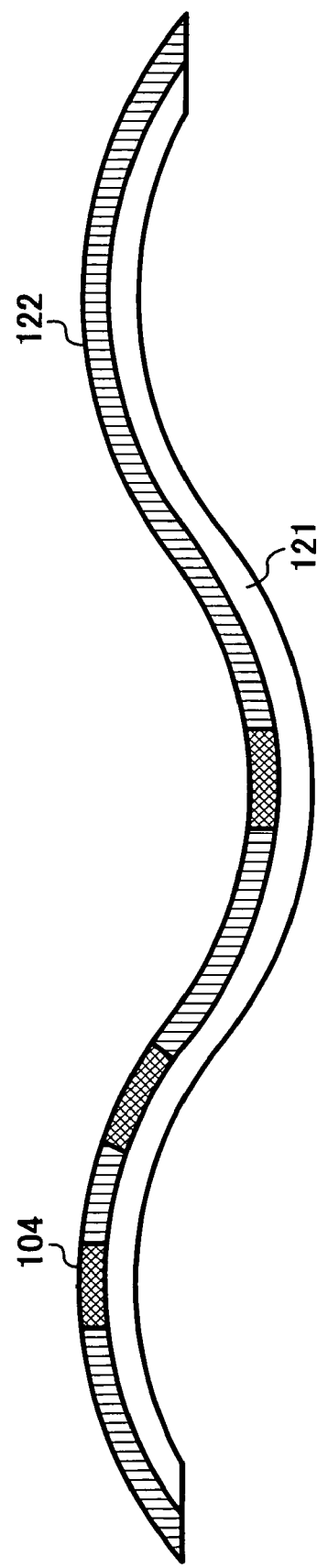
FIG. 12 is a schematic view of a wiring substrate in which a substrate to which a wiring pattern-transferring sheet in FIG. 10 is bonded to the substrate is constituted by a curved surface.

(1) In the wiring substrate (See FIG. 11(D)) produced by the producing method of Example 105, the non-dissolved portion 108 (protecting layer) of the viscosity-increasing layer is removed.

(2) An insulating member 123 of such as PVPh (polyvinyl phenol) is coated on the above wiring substrate. See FIG. 14(A).

(3) After a given pattern of the conductor 104 (gate electrode) and the semiconductor 112 of the wiring pattern-transferring sheet produced by the producing method of Example 106 is aligned with the given electrically conductive wiring patterns 104 (source electrode and drain electrode) of the above wiring substrate, the transferring sheet is closely attached to the wiring substrate via the insulator 123, and they are joined together by beating at 100 to 250° C. See FIG. 14(B).

(4) Next, the Teflon film is removed, and the viscosity-increasing layer 102 made of the water-soluble film is removed by dissolution, thereby forming a transistor. The non-dissolved portion 108 of the viscosity-increasing layer 102 becomes a protective film for the conductor (gate electrode). See FIG. 14(C).

Figure 14C:
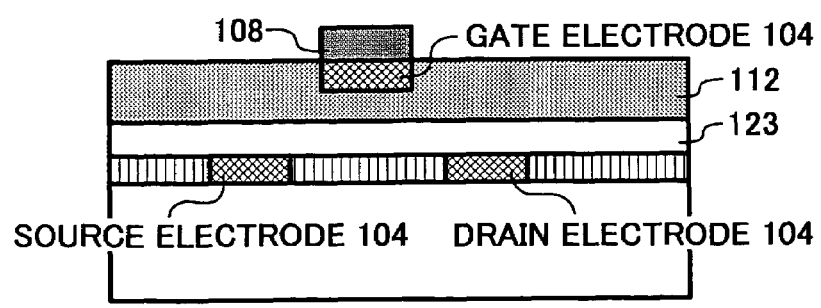

The organic semiconductor transistor produced by the producing method of the above Example 107 is shown in FIG. 14(C), and has the following construction.

The given electrically conductive wiring pattern 104 (source electrode and drain electrode) is bonded, with the adhesive layer 122, onto the support 121 to which the electrically conductive wiring pattern is transferred, and the insulating layer 123 is formed thereon. The organic semiconductor layer 112 having the electrically conductive wiring pattern 104 (gate electrode) with the protective film is formed on the insulating layer.

The effects of the present invention will be summarized as follows.

1. When the viscosity-increasing layer made of the water-soluble polymer is provided on the support, the viscosity of the electrically conductive ink is changed from the low level to the high level at the contacting portion between the aqueous, electrically conductive ink and the water-soluble polymer. This prevents disturbance of the given shape of the pattern, so that the electrically conductive wiring pattern having continuity can be formed on the support at high accuracy.

Further, when the printing (transferring) technique is used, the number of the producing step is small with smaller amount of the waste. Thus, this method has high resource productivity with saved energy and low cost.

2. When the viscosity-increasing layer is constituted by water-soluble cellulose, the producing method is highly safe and inexpensive.
3. When the thickness of the viscosity-increasing layer is reduced, influence due to absorption can be removed, so that both the continuity and the shape accuracy for electrical conduction can be satisfied. Different from the viscosity being increased by the absorption of water, the effect can be exhibited even if the viscosity-increasing layer is thin. If the content of the viscosity-increasing layer is 0.1 wt % relative to the electrically conductive ink, the viscosity-increasing effect is effective. Depending upon the amount of the ink, 0.1 „m thickness suffices.
4. When the electrically conductive ink contains the functional groups reactive with the OH groups as mentioned above, the portion under the electrically conductive wiring pattern can be selectively insolubilized to form the protective layer for the electrically conductive wiring pattern. The wiring substrate having such a protective layer has high reliability to water, and no protective layer needs be separately formed.
5. When the electrically conductive ink pattern is formed by using the plate formed with the given pattern based upon difference in the wettability as mentioned above, the wiring substrate can be produced by the smaller number of the steps with a smaller cost.
6. When the electrically conductive wiring pattern formed on the wiring pattern-transferring sheet is transferred onto the support on which the wiring pattern is to be transferred as mentioned above, the electronic device such as the wiring substrate can be produced. Further, it is possible to avoid damages such as damages on the wiring following the peeling of the support for the wiring pattern-transferring sheet. Further, the protective layer protecting the electrically conductive wiring pattern can be simultaneously formed when the wiring pattern is transferred.
7. Even when the support to which the wiring pattern is to be transferred comprises the surface constituted by a curved surface and/or a plurality of the flat surfaces as mentioned above, the electrically conductive wiring pattern can be formed at a lower cost and high accuracy.
8. When the transistor is produced by the printing/transferring process as mentioned above, the active circuit can be formed on the surface constituted by the curved surface and/or a plurality of the flat surfaces at a lower cost.

What is claimed is:

1. A wiring pattern-forming apparatus, comprising:
   a transfer plate configured to transfer a wiring material onto a substrate;
   a wiring material feeder configured to feed said wiring material in liquid form onto said transfer plate;
   a heating device which is disposed adjacent to the transfer plate and is configured to heat said wiring material on the transfer plate and increase a viscosity of said wiring material on the transfer plate; and
   an additional heating device disposed adjacent to the substrate, the additional heating device adjacent to the substrate being configured to heat the wiring material on the transfer plate, such that the wiring material on the transfer plate is transferred onto the substrate, wherein
   said transfer plate has a surface formed with a wiring pattern including hydrophilic portions and hydrophobic portions such that said wiring material in liquid form is arranged to form said wiring pattern onto said substrate.

2. The wiring pattern-forming apparatus set forth in claim 1, wherein the wiring material is changed to a gelled state when the viscosity is made greater.

3. The wiring pattern-forming apparatus set forth in claim 2, wherein the wiring material is changed to the gelled state by crosslinking through a chemical reaction.

4. The wiring pattern-forming apparatus set forth in claim 1, wherein the wiring material contains soluble cellulose.

5. The wiring pattern-forming apparatus set forth in claim 1, wherein the heat is fed to the wiring material by heating the transfer plate with the heating device.

6. The wiring pattern-forming apparatus set forth in claim 5, wherein the wiring material is heated to 50° C. to 70° C. with the heating device.

7. The wiring pattern-forming apparatus set forth in claim 1, wherein the heat is fed to the wiring material by heating the transfer plate with the heating device.

8. The wiring pattern-forming apparatus set forth in claim 7, wherein the wiring material is solidified by heating the material with said heat.

9. The wiring pattern-forming apparatus set forth in claim 1, wherein the transfer plate is installed around an outer periphery of a cylindrical roller.

10. The wiring pattern-forming apparatus set forth in claim 1, wherein the heating device adjacent to the transfer plate is disposed near a contacting portion between the substrate and the transfer plate.

* * * * *